US007583528B2

(12) United States Patent
Aoki

(10) Patent No.: US 7,583,528 B2
(45) Date of Patent: Sep. 1, 2009

(54) MAGNETIC MEMORY DEVICE, METHOD FOR WRITING INTO MAGNETIC MEMORY DEVICE AND METHOD FOR READING MAGNETIC MEMORY DEVICE

(75) Inventor: Masaki Aoki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 223 days.

(21) Appl. No.: 11/848,571

(22) Filed: Aug. 31, 2007

(65) Prior Publication Data
US 2008/0175041 A1    Jul. 24, 2008

Related U.S. Application Data

(63) Continuation of application No. PCT/JP2005/003740, filed on Mar. 4, 2005.

(51) Int. Cl.
*G11C 11/00* (2006.01)
(52) U.S. Cl. ............................ 365/158; 365/66; 365/72; 365/189.15; 365/189.16
(58) Field of Classification Search ................. 365/158, 365/66, 72, 189.15, 189.16, 225.5
See application file for complete search history.

(56) References Cited

U.S. PATENT DOCUMENTS

| 5,903,492 | A | 5/1999 | Takashima | |
|---|---|---|---|---|
| 6,226,197 | B1 | 5/2001 | Nishimura | |
| 7,068,530 | B2 * | 6/2006 | Hayashi | 365/158 |
| 7,245,522 | B2 * | 7/2007 | Aoki | 365/158 |
| 7,414,879 | B2 * | 8/2008 | Asao et al. | 365/158 |
| 7,489,577 | B2 * | 2/2009 | Sato et al. | 365/210.1 |
| 2002/0097598 | A1 | 7/2002 | Hoenigschmid | |
| 2002/0135018 | A1 | 9/2002 | Hidaka | |
| 2004/0095802 | A1 | 5/2004 | Tran | |
| 2004/0113187 | A1 | 6/2004 | Cha | |
| 2004/0174732 | A1 | 9/2004 | Morimoto | |

FOREIGN PATENT DOCUMENTS

JP    2003016774 A    1/2003
JP    2004213744 A    7/2004

OTHER PUBLICATIONS

Search Report dated Jun. 7, 2005 issued in parent Application No. PCT/JP2005/003740.

* cited by examiner

*Primary Examiner*—Pho M Luu
*Assistant Examiner*—Toan Le
(74) *Attorney, Agent, or Firm*—Westerman, Hattori, Daniels & Adrian, L.L.P.

(57) ABSTRACT

A magnetic memory device includes a first signal line (BL) and a second signal line (/BL) extended column-wise; a third signal line (WL) extended row-wise; a memory cell including a first parallelly connected set which is disposed at the intersection of the first signal line and the third signal line, including a first magnetoresistive effect element ($MTJ_1$) and a first select transistor ($Tr_1$) and having one end connected to the first signal line; a second parallelly connected set which is disposed at the intersection of the second signal line and the third signal line, including a second magnetoresistive effect element ($MTJ_2$) and a second select transistor ($Tr_2$) and having one end connected to the second signal line; and a read circuit connected to the first signal line and the second signal line, for reading information memorized in the memory cell, based on voltages of the first signal line and the second signal line.

19 Claims, 17 Drawing Sheets

MAGNETIC MEMORY DEVICE, METHOD FOR WRITING INTO MAGNETIC MEMORY DEVICE AND METHOD FOR READING MAGNETIC MEMORY DEVICE

CROSS REFERENCE TO RELATED APPLICATIONS

This application is a Continuation of International Application No. PCT/JP2005/003740, with an international filing date of Mar. 4, 2005, which designating the United States of America, the entire contents of which are incorporated herein by reference.

TECHNICAL FIELD

The present invention relates to a magnetic memory device, more specifically a magnetic memory device whose resistance value is changed, based on magnetization directions of the magnetic layers, and a method of writing into the magnetic memory device and a method of reading the magnetic memory device.

BACKGROUND

Recently, as a rewritable nonvolatile memory, the magnetic random access memory (hereinafter called MRAM) including magnetoresistive effect elements arranged in a matrix is noted. The MRAM memorizes information by using combinations of magnetization directions of the magnetic layers and reads memorized information by detecting resistance changes (i.e., current changes or voltage changes) between the parallel magnetization directions of the magnetic layers and the anti-parallel magnetization directions of the magnetic layers.

As one of the magnetoresistive effect elements forming the MRAM is known the magnetic tunnel junction (Hereinafter called MTJ) element. The MTJ element includes two ferromagnetic layers stacked with a tunnel insulating film formed therebetween and utilizes the phenomenon that the tunneling current flowing between the magnetic layers via the tunnel insulating film changes based on relationships of the magnetization directions of the two ferromagnetic layers. That is, the MTJ element has low element resistance when the magnetization directions of the two ferromagnetic layers is parallel with each other, and when the magnetization directions of the two ferromagnetic layers are anti-parallel with each other, has high element resistance. These two states are related to data "0" and data "1" to be used as the memory device.

As memory cells of the conventional MRAM are known the so-called 2T-2MTJ type MRAM comprising memory cells each including two select transistors and two MTJ elements, and the so-called 1T-1MTJ type MRAM comprising memory cells each including one select transistor and one MTJ element.

In the 2T-2MTJ type MRAM, information complementary to each other is written into two MTJ elements, and the information memorized in the memory cells is read by comparing to judge which MTJ elements have the high resistance state and the low resistance state. The 2T-2MTJ type MRAM is superior in the stability of the read operation, and at the start of the development of the MRAM, the 2T-2MTJ type MRAM was the major memory cell structure. However, the 2T-2MTJ type MRAM has the memory cells each including many constituent elements, which is disadvantageous in the integration. In the field of memories, it is usual to compare the areas of the memory cells with the minimum feature size being F. Based on this index, the memory cell size of the 2T-2MTJ type MRAM is 16 $F^2$.

The 1T-1MTJ type MRAM is a memory cell structure proposed as a structure which can be more integrated. The number of the constituent elements of one memory cell of the 1T-1MTJ type MRAM is a half the element number of the 2T-2MTJ type MRAM. This is advantageous in the integration. Based on the index described above, the memory cell size of the 1T-1MTJ type MRAM is 8 $F^2$. In the 1T-1MTJ type MRAM, however, memorized information is read by the comparison with a reference signal potential, which makes the operation margin smaller than the 2T-2MTJ type MRAM.

As memory cell structures which can be further integrated, the so-called NAND-type circuit MRAM (hereinafter called NAND-type MRAM) is disclosed in, e.g., Japanese published unexamined patent application No. 2004-200641, Japanese published unexamined patent application No. 2004-213744, and U.S. patent unexamined publication No. 2002/0097598. As shown in FIG. 1, the NAND-type MRAM includes a unit cell block 200 including a plurality of serially connected 1T-1MTJ type memory cells (MC) each including a select transistor (Tr) and an MTJ element (MTJ) parallelly connected. The unit cell block 200 has one end connected to a power supply line 202 via a cell block select transistor $Tr_{sel}$ and has the other end connected to a read line 204. The NAND-type MRAM, which needs no contact region between each of the serially connected memory cells and its adjacent one, can be integrated more easily than the usual 1T-1MTJ type MRAM and, based on the above-described index, can be integrated up to about 4 $F^2$.

However, the conventional magnetic memory devices have smaller read operation margins as the memory cell structures have higher integration of the memory cells.

SUMMARY

A magnetic memory device according to various embodiments of the present invention includes memory cells each including a first parallelly connected set of a first magnetoresistive effect element and a first select transistor parallelly arranged and a second parallelly connected set including a second magnetoresistive effect element and a second select transistor, a gate electrode of the first select transistor and a gate electrode of the second select transistor being connected to each other.

DETAILED DESCRIPTION OF THE EMBODIMENTS

Figure 1:
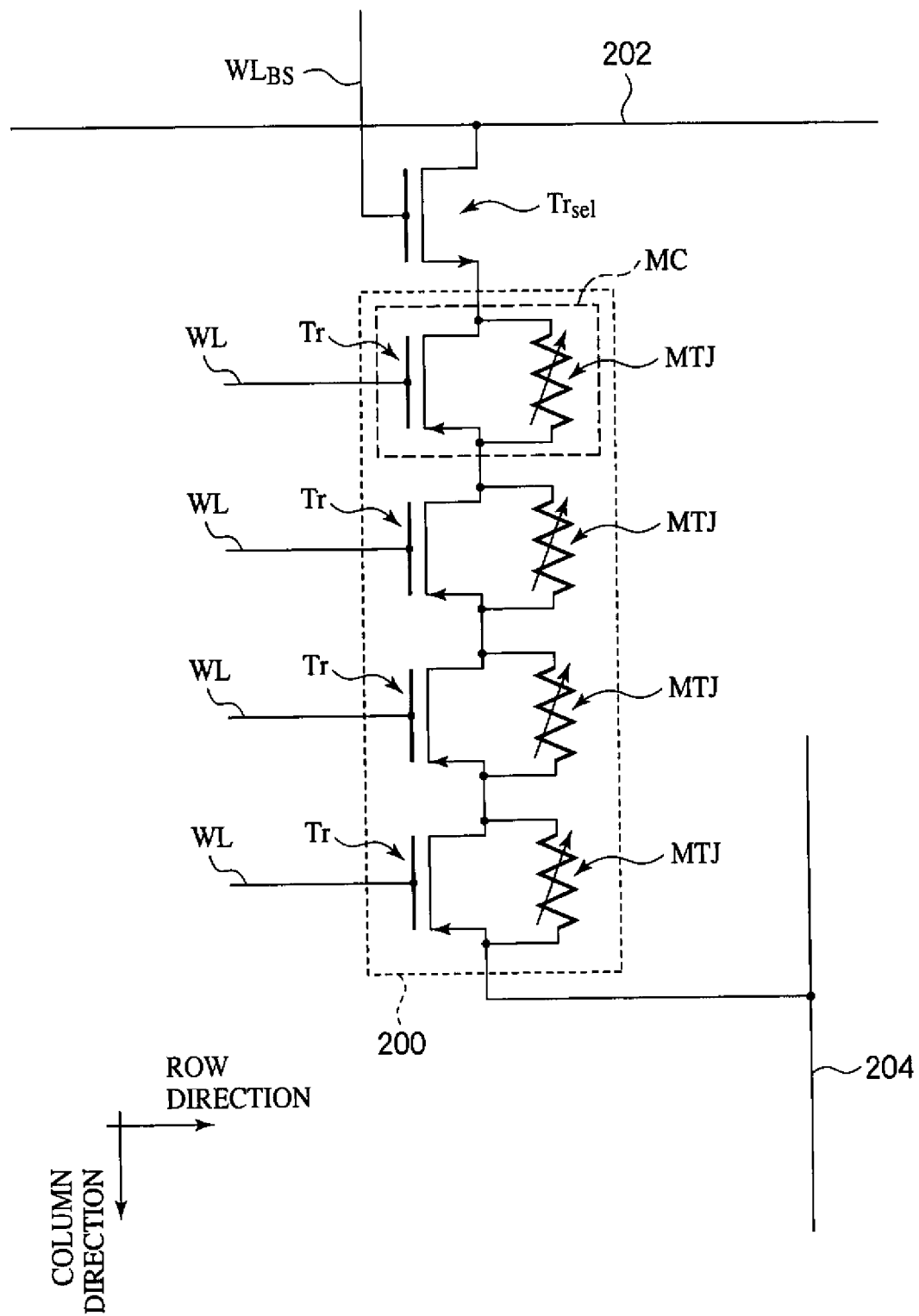
FIG. 1 is a circuit diagram showing the structure of the conventional magnetic memory device.

The magnetic memory device, the method for writing into the magnetic memory device and the method for reading the magnetic memory device according to an embodiment of the present invention will be explained with reference to FIGS. 2 to 11D.

First, the structure of the magnetic memory device according to the present embodiment will be explained with reference to FIG. 2.

Each of a Memory cells (MC) includes two parallelly connected sets each including one select transistor (Tr) and one MTJ element (MTJ) parallelly connected. These parallelly connected sets are arranged row-wise (transversely as viewed in the drawing), and the gate electrodes of the select transistors (Tr) are interconnected to each other by word line WL extended row-wise.

The parallelly connected sets adjacent column-wise are serially connected column-wise, respectively forming NAND-type cell blocks 100a, 100b. Here, the NAND-type cell block is a structure that the parallelly connected sets of the select transistor and the MTJ element are serially connected.

The NAND-type cell block 100a and the NAND-type cell block 100b form a unit cell block 100 which is a basic unit of the writing and reading. In FIG. 2, four memory cells are serially connected, and forming a unit cell block 100, but a number of the memory cells forming a unit cell block 100 is not essentially four.

The unit cell block 100 has one end connected to bit lines (BL, /BL) extended column-wise via a cell block select circuit ($SEL_{block}$). More specifically, the NAND-type cell block 100a is connected to the bit line (BL) via the cell block select transistor $Tr_{sel1}$ of the cell block select circuit ($SEL_{block}$), and the NAND-type cell block 100b is connected to the bit line (/BL) via the cell block select transistor $Tr_{sel2}$ of the cell block select circuit ($SEL_{block}$). The NAND-type cell blocks 100a, 100b have the other end connected to a ground line GL.

The bit lines (BL, /BL) have one ends connected to sense circuit 104 and a current driver 106 via the column select circuit 102. The bit lines (BL, /BL) have the other ends connected a current control circuit 108.

The word lines (WL) have one ends connected to a word line driver 112 and a current driver 114 via a row select circuit 110.

As described above, the magnetic memory device according to the present embodiment is a NAND-type magnetic memory device including 2T-2MTJ type memory cells each including two select transistors (Tr) and two MTJ elements (MTJ). The memory cell array is thus formed, whereby the integration of the memory cell array can be improved, and the reading operation margin can be increased.

Figure 3:
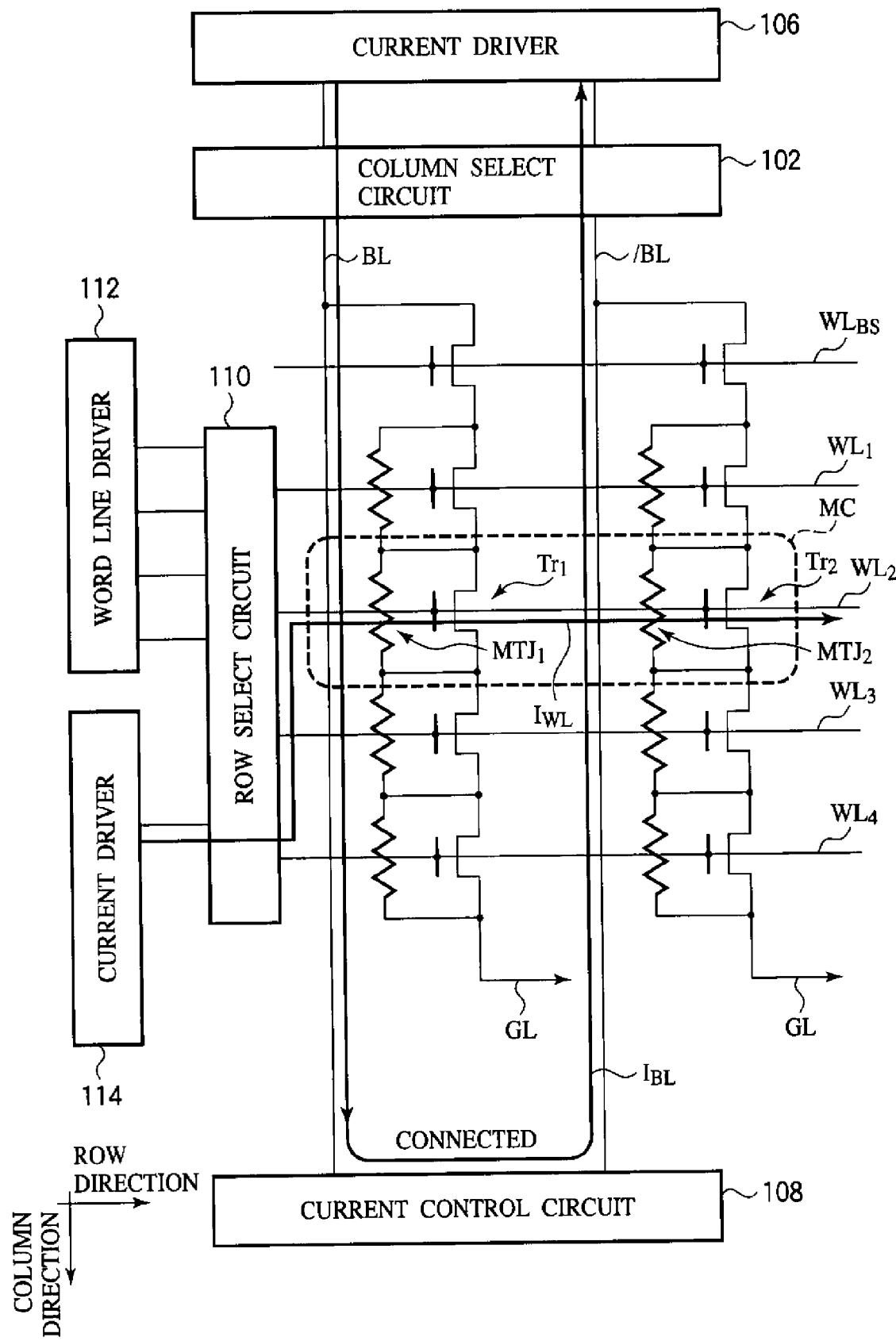
FIG. 3 is a circuit diagram showing a method for writing into the magnetic memory device according to an embodiment of the present invention.

Then, the method for writing into the magnetic memory device according to the present embodiment will be explained with reference to FIG. 3. Here, it is assumed that prescribed information is written into the memory cell (MC) connected to the word line $WL_2$.

As described above, the magnetic memory device according to the present embodiment includes the 2T-2MTJ type memory cells (MC). The writing in such memory cell (MC) is so made that the two MTJ elements have a relationship complementary to each other. That is, the writing is made so that one of the MTJ elements has a state of higher resistance (high resistance state), and the other has a state of lower resistance (low resistance state).

The signal lines used in writing in the magnetic memory device according to the present embodiment are word lines (WL) and the bit lines (BL). The MTJ elements (MTJ) are disposed at the intersections between the word lines (WL) and the bit lines (BL, /BL).

First, the row select circuit 110 selects the word line ($WL_2$) connected to the memory cell (MC) to be written, and connects the current driver 114 and the word line ($WL_2$) via the row select circuit 110 to each other.

Then, a write current ($I_{WL}$) supplied from the current driver 114 is flowed through the word line ($WL_2$) via the row select circuit 110. Thus, column-wise magnetic field is applied to both of the MTJ elements ($MTJ_1$, $MTJ_2$) of the memory cell (MC).

Then, the column select circuit 102 selects a pair of bit lines (BL, /BL) connected to the memory cell (MC) to be written and connects the current driver 106 and the pair of bit lines (BL, /BL) to each other via the column select circuit 102. At the end opposite to the end connected to the column select circuit 102, the current control circuit 108 connects the bit line (BL) and the bit line (/BL) to each other. Thus, a current circuit of the bit line (BL), the current control circuit 108 and the bit line (/BL) serially connected is formed.

Then, a write current ($I_{BL}$) supplied from the current driver 106 is flowed through the bit line (BL) and the bit line (/BL) via the column select circuit 102 and the current control circuit 108. At this time, because the bit line (BL) and the bit line (/BL) are arranged, turned back via the current control circuit 108, the write current of the bit line (BL) connected to the NAND-type cell block 100a and the write current of the bit line (/BL) of the NAND-type cell block 100b oppositely flow. Thus, row-wise magnetic fields opposite to each other are applied to the MTJ element ($MTJ_1$) and the MTJ element ($MTJ_2$).

The currents to be flowed through the bit line (BL) and the bit line (/BL) are opposed suitably depending on information to be written into the memory cell (MC). For example, when data "0" is to be memorized, a current is flowed in the direction of the bit line (BL) to the bit line (/BL) (see FIG. 3), and when data "1" is to be memorized, a current is flowed in the direction of the bit line (/BL) to the bit line (BL). Data "0" and data "1" may be defined by the opposite states.

Thus, the synthetic magnetic filed of a magnetic field generated by a current flowed through the word line ($WL_2$) and a magnetic field generated by a current flowed through the bit line (BL) is applied to the MTJ element ($MTJ_1$), and the synthetic magnetic field of a magnetic field generated by a current flowed through the word line ($WL_2$) and a magnetic filed generated by a current flowed through the bit line (/BL) is applied to the MTJ element ($MTJ_2$), whereby a magnetic fields of above a threshold value necessary for the magnetization switching of the free magnetization layer are applied. The magnetic fields applied to the MTJ element ($MTJ_1$) and the MTJ element ($MTJ_2$) are opposite to each other, and resistance states complementary to each other can be memorized in the MTJ element ($MTJ_1$) and the MTJ element ($MTJ_2$).

Then, the method for reading the magnetic memory device according to the present embodiment will be explained with reference to FIGS. 4 and 5. Here, it is assumed that the MTJ element ($MTJ_1$) of the memory cell (MC) to be read has a high resistance state, and the MTJ element ($MTJ_2$) has the low resistance state.

First, the word line driver 112 and the word lines ($WL_1$-$WL_4$) are connected to each other by the row select circuit 110 to apply a prescribed drive voltage to the respective word lines ($WL_1$-$WL_4$). In the stand-by state before reading, a voltage $V_{dd}$ is applied to the respective word lines ($WL_1$-$WL_4$) (see FIG. 5).

Next, the word line driver 112 applies a prescribed drive voltage to the respective word lines ($WL_1$-$WL_4$). When memorized information is read from the memory cell (MC) connected to the word line ($WL_2$), the applied voltage to the selected word line ($WL_2$) is changed to a reference potential, and the applied voltage to the un-selected word lines ($WL_1$, $WL_3$, $WL_4$) is kept to be the voltage $V_{dd}$. Thus, the select transistors ($Tr_1$, $Tr_2$) of the memory cell (MC) connected to the selected word line ($WL_2$) is turned off (non-conductive state), and the select transistors connected to the un-selected word lines ($WL_1$, $WL_3$, $WL_4$) are turned on (conductive state) (see FIG. 4).

Then, the bit lines (BL, /BL) connected to the memory cell (MC) to be read are selected by the column select circuit 102, and the sense circuit 104 and the pair of bit lines (BL, /BL) are connected via the column select circuit 102. The bit line (BL) and the bit line (/BL) at the ends opposite to the ends connected to the column select circuit 102 are disconnected from each other by the current control circuit 108.

Then, the voltage $V_{dd}$ is applied to the cell block select word line ($WL_{BS}$) to turn on the cell block select transistors ($Tr_{sel1}$, $Tr_{sel2}$) of the column select circuit 102. Thus, sense currents $I_{s1}$, $I_{s2}$ which are supplied from the sense circuit 104 and are equal to each other flows into the respective unit cell blocks 100 via the bit lines (BL, /BL). More specifically, the sense current $I_{s1}$ flows into the NAND-type cell block 100a via the bit line (BL), and the sense current $I_{s2}$ flows into the NAND-type cell block 100b via the bit line (/BL).

The sense current $I_{s1}$ supplied to the NAND-type cell block 100a flows sequentially through the parallelly connected sets of the NAND-type cell block 100a via the cell block select transistor $Tr_{sel1}$ into the ground line GL. At this time, in the respective un-selected memory cells, the select transistor is on and has lower resistance than the MTJ element, and the sense current $I_{s1}$ flows through the select transistors of the parallelly connected sets. On the other hand, in the selected memory cell (MC), the select transistor ($Tr_1$) is off, and the MTJ element has lower resistance than the select transistor ($Tr_1$), and the sense current $I_{s1}$ flows through the MTJ element ($MTJ_1$) of the parallelly connected sets. Resultantly, the sense current $I_{s1}$ flows through the serially connected set of the cell block select transistor $Tr_{sel1}$, the three select transistors and the MTJ element ($MTJ_1$) of the selected memory cell (see FIG. 4). Then, to the bit line (BL), a voltage corresponding to a resistance state of the MTJ element ($MTJ_1$) is outputted (see FIG. 5).

Similarly, the sense current $I_{s2}$ supplied to the NAND-type cell block 100b flows sequentially through the parallelly connected sets of the NAND-type cell block 100b via the cell block select transistor $Tr_{sel2}$ into the ground line GL. At this time, in the respective un-selected memory cells, the select transistor is on and has lower resistance than the MTJ element, and the sense current $I_{s2}$ flows through the select transistors of the parallelly connected sets. On the other hand, in the selected memory cell (MC), the select transistor ($Tr_2$) is off, and the MTJ element has lower resistance than the select transistor ($Tr_2$), and the sense current $I_{s2}$ flows through the MTJ elements ($MTJ_2$) of the parallelly connected sets. Resultantly, the sense current $I_{s2}$ flows through the serially connected set of the cell block select transistor $Tr_{sel2}$, the three select transistors and the MTJ element ($MTJ_2$) of the selected memory cell (see FIG. 4). Then, to the bit line (/BL), a voltage corresponding to a resistance state of the MTJ element ($MTJ_2$) is outputted (see FIG. 5).

Figure 5:
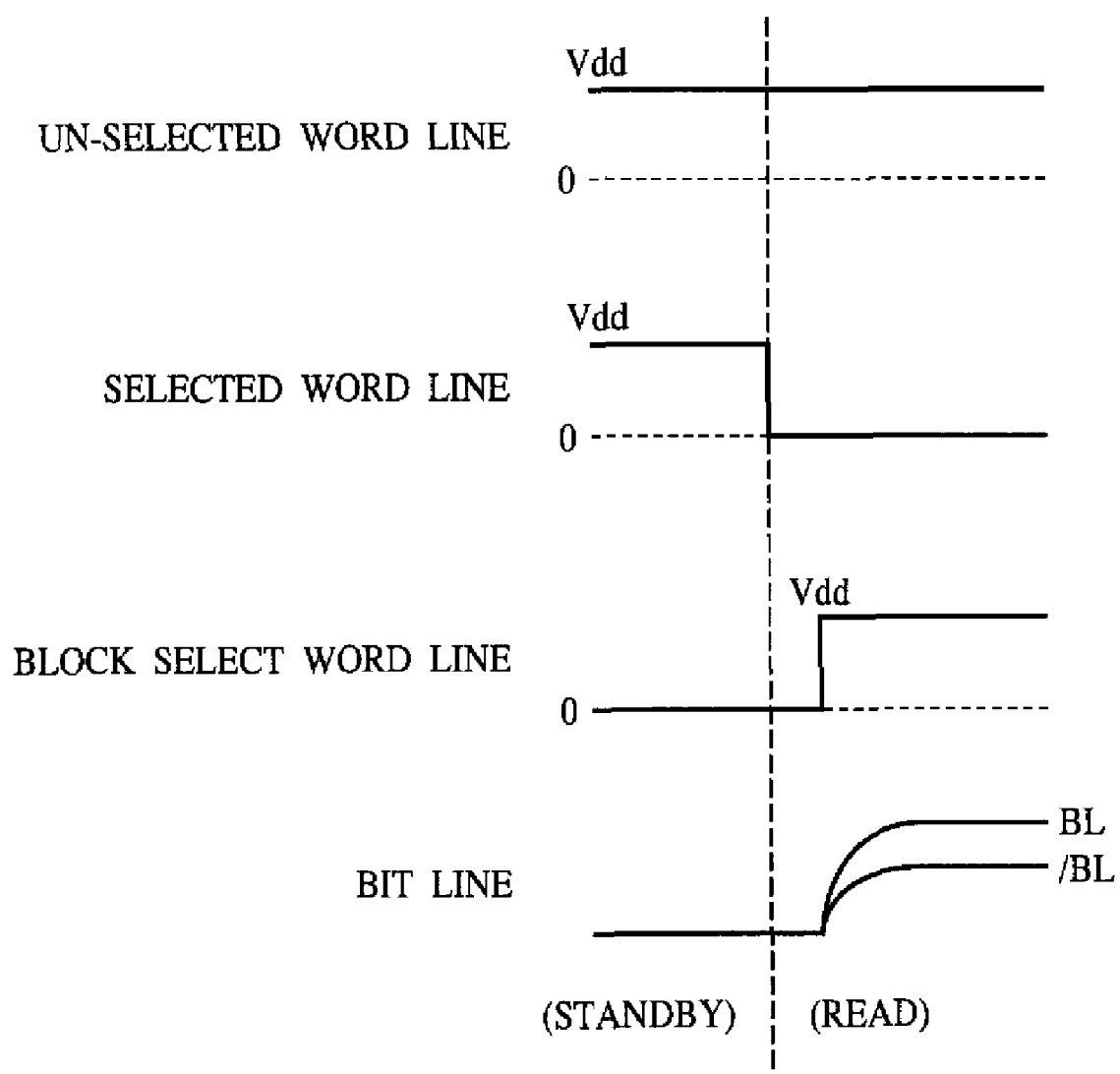
FIG. 5 is a time chart of the method for reading the magnetic memory device according to an embodiment of the present invention.

When the MTJ element ($MTJ_1$) of the memory cell (MC) to be read is in the high resistance state, and the MTJ element ($MTJ_2$) is in the low resistance state, a higher voltage is outputted to the bit line (BL) than to the bit line (/BL) (see FIG. 5). This voltage difference is amplified and compared by the sense circuit 104 to thereby read the information memorized in the memory cell (MC). For example, when it is assumed that the data with the MTJ element ($MTJ_1$) in the high resistance state and the MTJ element ($MTJ_2$) in the low resistance state is defined "0", and the data with the MTJ element ($MTJ_1$) in the low resistance state and the MTJ element ($MTJ_2$) in the high resistance state is defined "1", the information memorized in the memory cell (MC) is read to be the data "0".

In the NAND-type MRAM, to a resistance of the MTJ element of the memory cell to be read, a total sum of on-resistances of the select transistors of the rest memory cells of the unit cell block is added, and a change percentage of the resistance value as a whole due to changes of the resistance states of the MTJ element is low. Especially, in the conventional NAND-type MRAM, in which information memorized in the memory cell is read by comparing read signals with a reference signal, the read operation margin is very small.

In the NAND-type MRAM according to the present embodiment as well as in the conventional NAND-type MRAM, to a resistance of the MTJ element to be read, a total sum of the on-resistances of the select transistors of the rest memory cells of the unit cell block is added. However, a read signal with the MTJ element in the low resistance state and a read signal with the high resistance state are compared to thereby read the information memorized in the memory cell, whereby the on-resistances of the select transistors of the rest memory cells are not substantially influential, and the large read operation margin can be ensured.

As described above, the circuit structure of the magnetic memory device according to the present embodiment can drastically increase the read operation margin of the magnetic memory device in comparison with the conventional NAND-type MRAM.

Next, one example of the specific structure of the memory cell for realizing the circuit of FIG. 2 will be explained with reference to FIGS. 6 to 8.

In a silicon substrate 10, a device isolation film 12 defining a plurality of active regions extended column-wise is formed.

Over the silicon substrate 10 with the device isolation film 12 formed in, a plurality of word lines WL and a cell block select word line $WL_{BS}$ are formed. In the active regions on both sides of each word line WL, source/drain regions 16, 18 are formed. In the active regions on both sides of the cell block select word line $WL_{BS}$, source/drain regions 18, 20 are formed. Thus, in the respective active regions, a plurality of select transistors each including the gate electrode 14 also functioning as the word line WL and the source/drain regions 16, 18, and the cell block select transistor including the gate electrode 14 also function as the cell block select word line $WL_{BS}$ and the source/drain regions 18, 20 are formed. The adjacent transistors have the source/drain regions 16, 18 in common.

Over the silicon substrate 10 with the select transistors formed on, an inter-layer insulating film 22 is formed. In the inter-layer insulating film 22, contact plugs 38 connected to the source/drain regions 16 are buried. Over the inter-layer insulating film 22, a lower electrode layer 40 connected to the contact plugs 38 is formed.

Over the lower electrode layer 40 at the intersections between the active regions and the word lines WL, MTJ elements 52 are formed. The MTJ elements 52 adjacent column-wise with the contact plugs 38 formed therebetween are connected to each other by the lower electrode layer 40 and are electrically connected to the source/drain regions 16 via the contact plugs 38.

Figure 8:
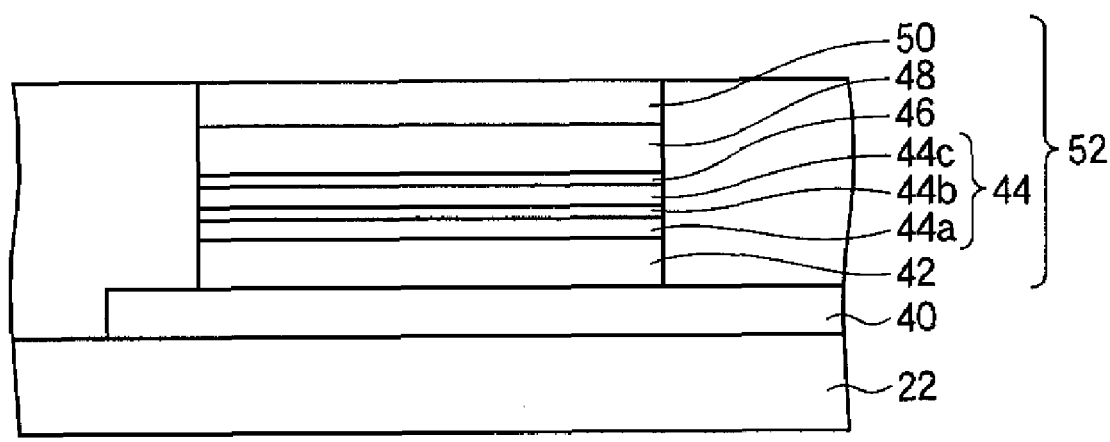
FIG. 8 is a partial sectional view showing the structure of the magnetic memory device according to an embodiment of the present invention.

As exemplified in FIG. 8, the MTJ elements 52 each includes an antiferromagnetic layer 42 of PtMn film, a pinned magnetization layer 44 of a CoFe film 44a, an Ru film 44b and a CoFe film 44c, a tunnel insulating film 46 of alumina film, a free magnetization layer 48 of NiFe film, and a cap layer 50 of Ta film.

Over the inter-layer insulating film 22 and the lower electrode layer 40 in the region except the regions where the MTJ elements 52 are formed, an inter-layer insulating film 54 is formed. In the inter-layer insulating films 54, 22, contact plugs 60 connected to the source/drain regions 18 and contact plugs 62 connected to the source/drain regions 20 are buried.

Over the inter-layer insulating film 54, an upper electrode layer 64 connected to the source/drain regions 18 via the contact plugs 60, and an interconnection layer 66 connected to the source/drain regions 20 via the contact plugs 62 are formed. The MTJ elements 52 adjacent with the contact plugs 60 formed therebetween are connected to each other by the upper electrode layer 64 and electrically connected to the source/drain regions 18 via the contact plugs 60.

Over the inter-layer insulating film 54 with the upper electrode layer 64 and the interconnection layer 66 formed on, an inter-layer insulating film 68 is formed. In the inter-layer insulating film 68, contact plugs 72 connected to the interconnection layer 66 are buried.

Over the inter-layer insulating film 68 with the contact plugs 72 buried in, bit lines 74 electrically connected with the source/drain regions 20 via the contact plugs 72, the interconnection layer 66 and the contact plugs 62 are formed.

Thus, the select transistors and the MTJ elements 52 formed thereabove are parallelly connected, forming parallelly connected sets. The parallelly connected sets arranged column-wise are serially connected, forming a unit cell block. The bit lines 74 are connected to one end of the unit cell block via the cell block select transistors.

The same structure is formed in the active regions adjacent row-wise, and two parallelly connected sets which are adjacent row-wise and connected to each other by the word line WL form one memory cell (MC).

Figure 6:
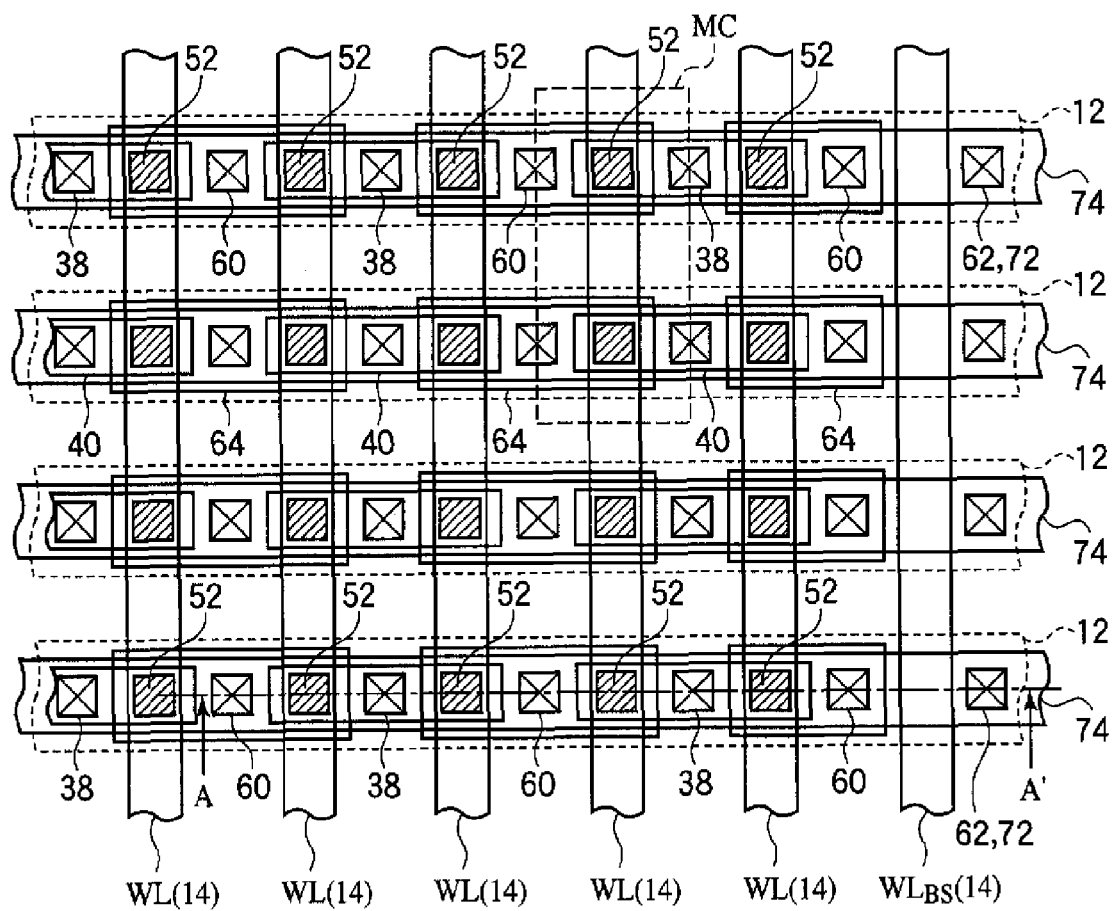
FIG. 6 is a plan view showing the structure of the magnetic memory device according to an embodiment of the present invention.
Figure 7:
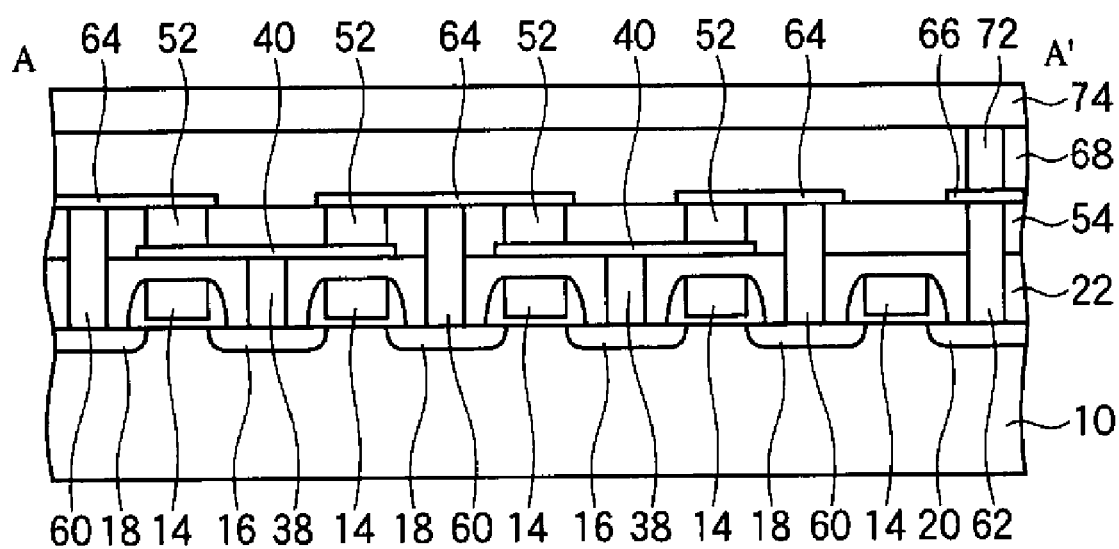
FIG. 7 is a diagrammatic sectional view showing the structure of the magnetic memory device according to an embodiment of the present invention.

In the plane layout of the magnetic memory device shown in FIG. 6, the word lines (WL) and the bit lines (BL) are arranged at a minimum pitch, whereby when the minimum feature size is F, the memory size is $2 F \times 4 F = 8 F^2$.

This cell size is equivalent to the memory cell size of the conventional 1T-1MTJ type MRAM.

The conventional NAND-type MRAM has a $4 F^2$ memory size and is more highly integrated than the magnetic memory device according to the present embodiment. However, the magnetic memory device according to the present embodiment can ensure the read operation margin equivalent to that of the conventional 2T-2MTJ type memory cell while can be integrated as high as the conventional 1T-1MTJ type MRAM. The magnetic memory device according to the present embodiment realizes a magnetic memory device of high reliability and high integration.

In the magnetic memory device according to the present embodiment, as the signal lines used in writing the MTJ element, the word lines (WL) and the bit lines (BL) are used. That is, the word lines (WL) are used as the write word lines. This makes it unnecessary to arrange write word lines between the select transistors and the MTJ elements, whereby the contacts connecting the lower electrode layer 40 and the source/drain regions 16 (contact plugs 38), and the contacts connection the upper electrode layer 64 and the source/drain regions 18 (contact plugs 60) can be made shallow. This facilitates manufacturing the magnetic memory device.

Figure 9:
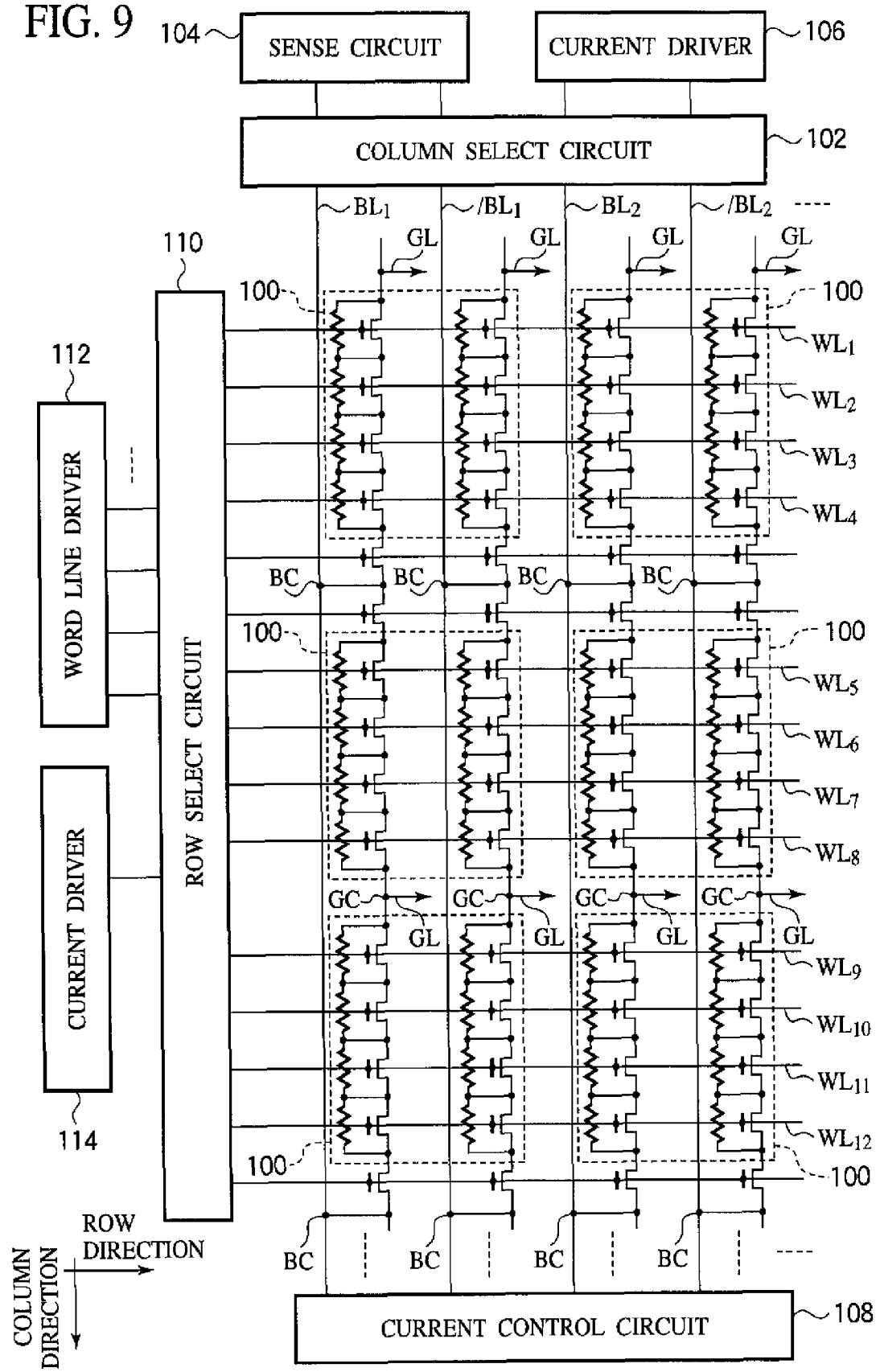
FIG. 9 is another circuit diagram showing the structure of the magnetic memory device according to an embodiment of the present invention.

FIG. 9 shows one example of the circuit diagram of the unit cell blocks 100 of the memory cells developed in matrix. In the example of FIG. 9, the unit cell blocks 100 are arranged, turned back column-wise, whereby the column-wise adjacent unit cell blocks 100 can have the contacts (BC) to the bit lines (BL or /BL) and the contact (GC) to the ground line (GL) in common. Thus, the unit cell blocks 100 can be more densely arranged, and the integration of the magnetic memory device can be improved.

Next, the method of manufacturing the magnetic memory device according to the present embodiment will be explained with reference to FIGS. 10A to 11D.

First, in the silicon substrate 10, the device isolation film 12 is formed by, STI (Shallow Trench Isolation) method. Thus, stripe-shaped active regions are defined in the silicon substrate 10.

Figure 10A:
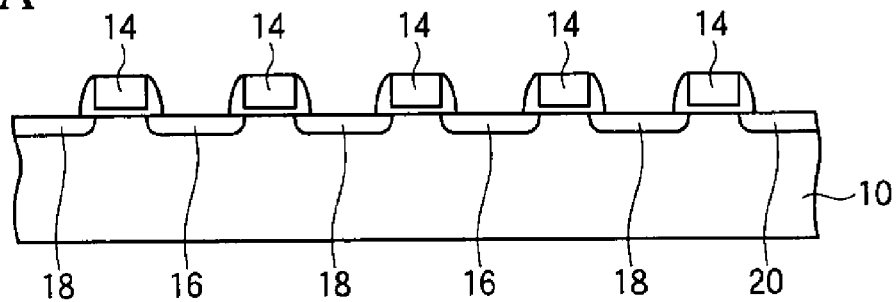
FIGS. 10A-10D and 11A-11D are sectional views showing the method of manufacturing the magnetic memory device according to an embodiment of the present invention.

Then, in the active regions defined by the device isolation film 12, the select transistors each including the gate electrode 14 and the source/drain regions 16, 18, and the cell block select transistor including the gate electrode 14 and the source/drain regions 18, 20 are formed in the same way as in the usual MOS transistor manufacturing method (FIG. 10A).

Then, over the silicon substrate with the select transistors and the cell block select transistors formed on, a silicon oxide film is deposited by, e.g., CVD method, and the surface is planarized by CMP method to form the inter-layer insulating film 22 of the silicon oxide film.

Then, by photolithography and dry etching, the contact holes 36 down to the source/drain regions 16 are formed in the inter-layer insulating film 22.

Figure 10B:
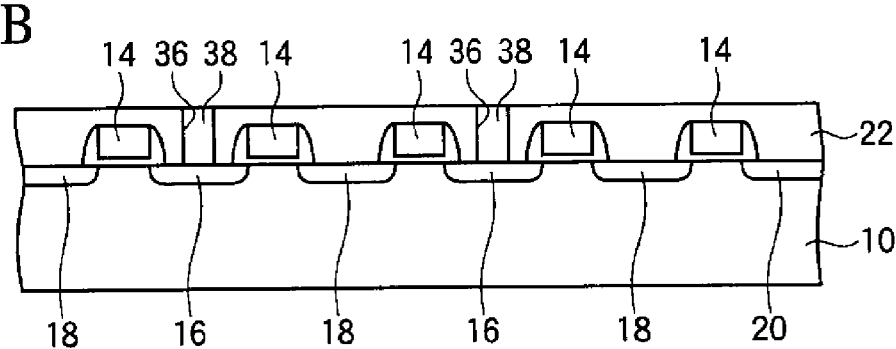

Next, by, e.g., CVD method, titanium nitride film as the barrier metal and tungsten film are deposited, and then these conductive films are etched back or polished back to form the contact plugs 38 buried in the contact holes 36 and electrically connected to the source/drain regions 16 (FIG. 10B).

Next, by, e.g., sputtering method, e.g., a 40 nm-thickness Ta film 40a, the antiferromagnetic layer 42 of, e.g., a 15 nm-thickness PtMn film, the pinned magnetization layer 44 of, e.g., a 2 nm-thickness CoFe film 44a, e.g., a 0.9 nm-thickness Ru film 44b and, e.g., a 3 nm-thickness CoFe film 44c, the tunnel insulating film 46 of, e.g., a 1.2 nm-thickness alumina film, the free magnetization layer 48 of, e.g., a 6 nm-thickness NiFe, and the cap layer 50 of, e.g., a 30 nm-thickness Ta film are sequentially formed (see FIG. 8).

Figure 10C:
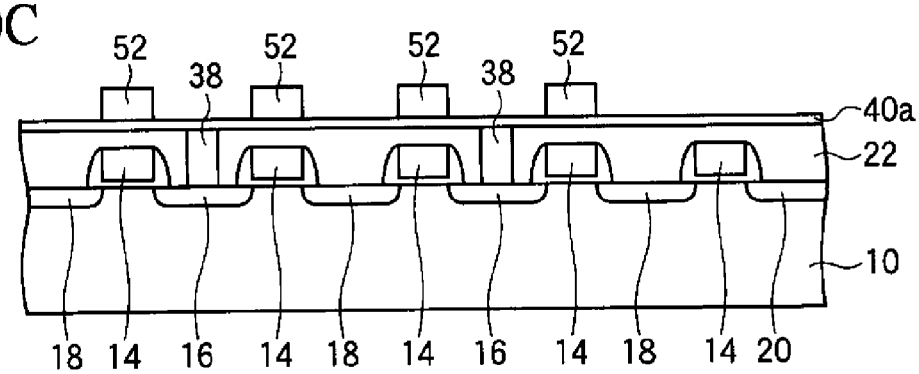

Then, by photolithography and dry etching, the cap layer 50, the free magnetization layer 48, the tunnel insulating film 46, the pinned magnetization layer 44 and the antiferromagnetic layer 42 are patterned to form the MTJ elements 52 (FIG. 10C).

Figure 10D:
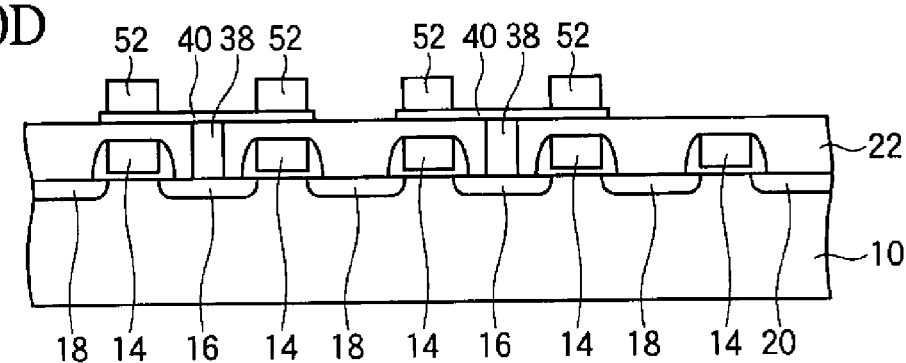

Then, by photolithography and dry etching, the Ta film 40a is patterned to serially connect the MTJ elements 52 adjacent column-wise with the contact plugs 38 formed therebetween while forming the lower electrode layer 40 connected to the source/drain regions 16 of the select transistors (FIG. 10D).

Next, over the inter-layer insulating film 22 with the MTJ elements 52 formed on, a silicon oxide film is deposited by, e.g., CVD method and then is planarized by CMP method until the MTJ elements 52 are exposed to form the inter-layer insulating film 54 of the silicon oxide film having the surface planarized.

Then, by photolithography and dry etching, the contact holes 56 down to the source/drain regions 18 and the contact holes 58 down to the source/drain regions 20 are formed in the inter-layer insulating films 54, 22.

Figure 11A:
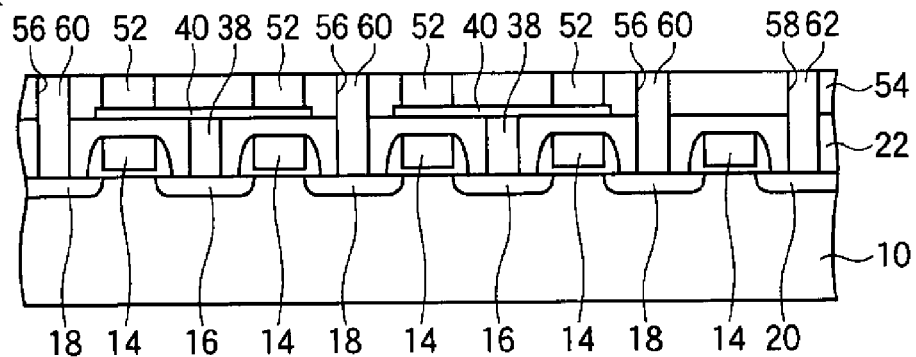

Then, by, e.g., CVD method, titanium nitride film as the barrier metal and tungsten film are deposited, and then these conductive films are etched back or polished back to form the contact plugs 60 buried in the contact holes 56 and electrically connected to the source/drain regions 18 and the contact plugs 62 buried in the contact holes 58 and electrically connected to the source/drain regions 20 (FIG. 11A).

Figure 11B:
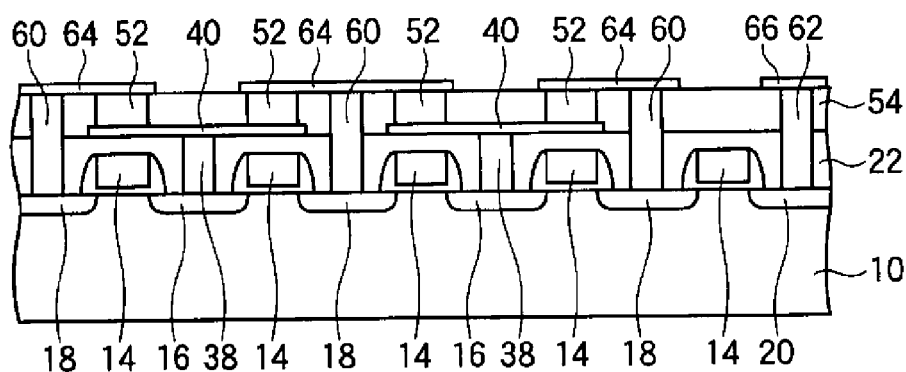

Next, over the inter-layer insulating film 54 with the MTJ elements 52 and the contact plugs 60, 62 buried in, a conductive film is deposited and patterned to form the upper electrode layer 64 serially connecting the column-wise adjacent MTJ elements 52 with the contact plugs 60 formed therebetween and connect the source/drain regions 18 of the select transistors, and the interconnection layer 68 connected to the contact plugs 62 (FIG. 11B).

Next, over the inter-layer insulating film 54 with the upper electrode layer 64 and the interconnection layer 66 formed on, a silicon oxide film is deposited by, e.g., CVD method and then planarized by CMP method to form the inter-layer insulating film 68 of the silicon oxide film having the surface planarized.

Then, by photolithography and dry etching, the contact holes 70 down to the interconnection layer 66 are formed in the inter-layer insulating film 68.

Figure 11C:
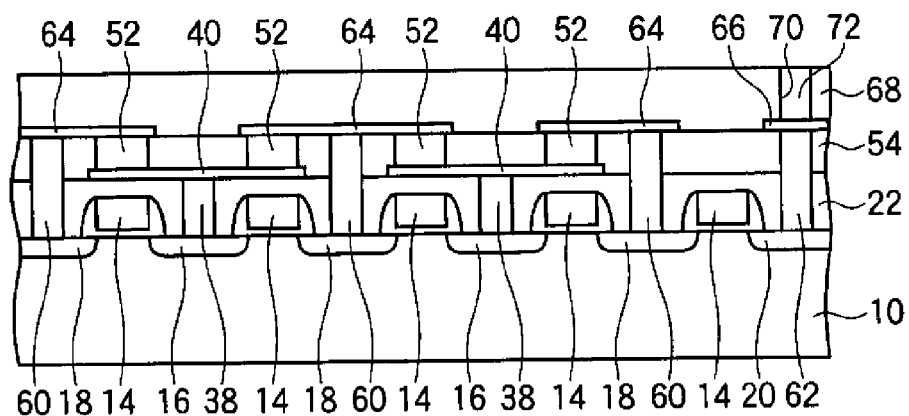

Then, by, e.g., CVD method, titanium nitride film as the barrier metal and tungsten film are deposited, and these conductive films are etched back or polished back to form the contact plugs 72 buried in the contact holes 70 and connected to the interconnection layer 66 (FIG. 11C).

Next, a conductive film is deposited over the inter-layer insulating film 68 with the contact plugs 72 buried in and patterned to form the bit lines electrically connected to the source/drain regions 20 via the contact plugs 72, the interconnection layer 66 and the contact plugs 62 (FIG. 1D).

Then, insulating layers, interconnection layers, etc. are further formed thereon as required, and the magnetic memory device is completed.

As described above, according to the present embodiment, the basic cell block includes 2T-2MTJ type memory cells each having two NAND-type cell-blocks parallelly arranged, whereby the high integration which is an advantage of the NAND-type MRAM, and the large writing operation margin which is an advantage of the 2T-2MTJ type memory can be both realized. Specifically, the memory cell size which is substantially the same as the 1T-1MTJ type MRAM can ensure the reading operation margin equal to that of the 2T-2MTJ type MRAM. Thus, the magnetic memory device can have high reliability and high integration.

The word lines are used as the signal lines for writing into the memory cells, which makes it unnecessary to additionally provide write word lines. This allows the contact holes for parallelly connecting the MTJ elements and the select transistors to be shallow, and the manufacturing steps can be simplified. This improves the manufacturing yield and decrease the product cost.

The magnetic memory device, the method for writing into the magnetic memory device and the method for reading the magnetic memory device according to another embodiment of the present invention will be explained with reference to FIGS. 12 to 17C. The same members of the present embodiment as those of the magnetic memory device, the method for writing into the magnetic memory device and the method for reading the magnetic memory device according to an embodiment shown in FIGS. 2 to 11D are represented by the same reference numbers not to repeat or to simplify their explanation.

In the present embodiment, the magnetic memory device including the word lines and the write word lines separately provided, and the writing method and the read method of the magnetic memory device will be explained.

First, the structure of the magnetic memory device according to the present embodiment will be explained with reference to FIG. 12.

Figure 2:
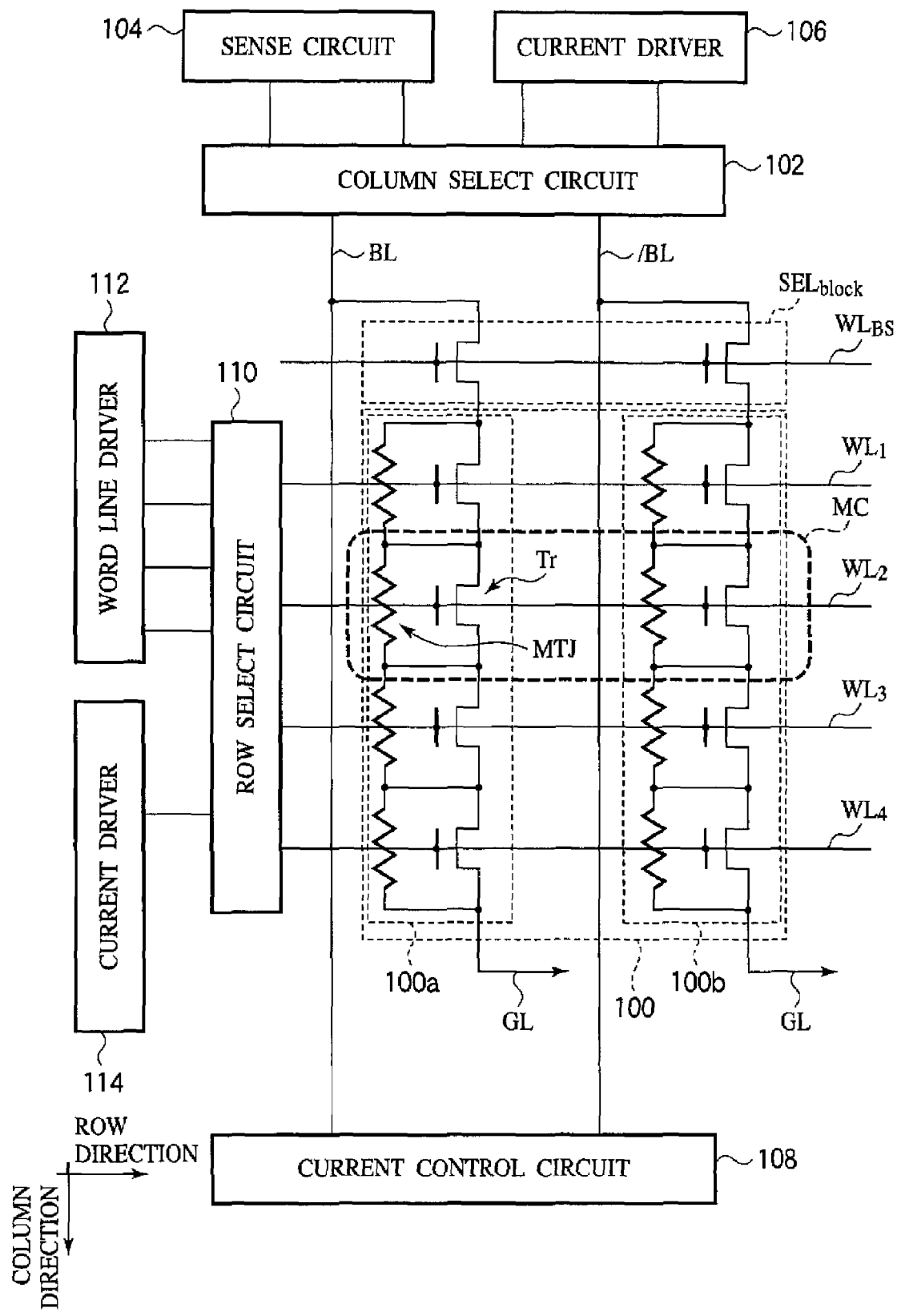
FIG. 2 is a circuit diagram showing a structure of the magnetic memory device according to an embodiment of the present invention.
Figure 12:
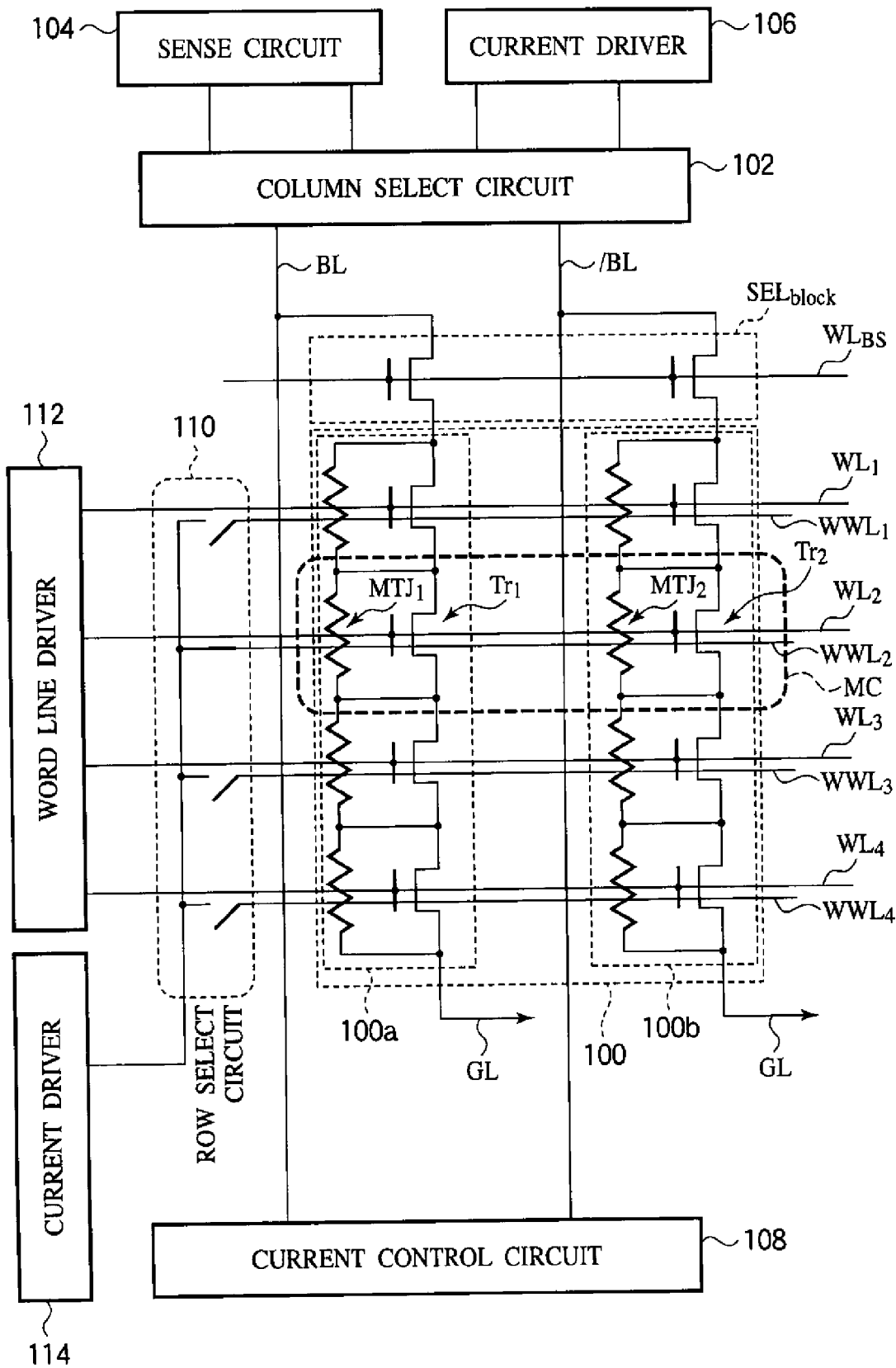
FIG. 12 is a circuit diagram showing a structure and a method for writing into the magnetic memory device according to another embodiment of the present invention.

As shown in FIG. 12, the magnetic memory device according to the present embodiment is basically the same as the magnetic memory device according to an embodiment shown in FIG. 2 except that in the former a plurality of write word lines (WWL) are further provided.

The respective write word lines (WWL) are formed, extended row-wise and so arranged that magnetic fields for writing can be applied to the row-wise adjacent MTJ elements (MTJ) of the memory cells.

One ends of the write word lines (WWL) are connected to a current driver 114 via a row select circuit 110. Thus, a write current supplied from the current driver 114 can be flowed through a prescribed write word line (WWL). In the magnetic memory device according to the present embodiment, no write current is flowed through the word lines (WL), and it is not necessary to connect the current driver 114 to the word lines (WL).

Next, the method for writing into the magnetic memory device according to the present embodiment will be explained with reference to FIG. 12. Here, it is assumed that prescribed information is written in the memory cells (MC) connected to the word line $WL_2$.

First, the row select circuit 110 selects the write word line ($WWL_2$) associated with the memory cell (MC) to be written, and the current driver 114 and the write word line ($WWL_2$) are connected via the row select circuit 110.

Then, a write current ($I_{WL}$) supplied from the current driver 114 is flowed through the write word line ($WWL_2$) via the row select circuit 110. Thus, column-wise magnetic field is applied to both MTJ elements ($MTJ_1$, $MTJ_2$) of the memory cell (MC).

Then, the column select circuit 102 selects a pair of bit lines (BL, /BL) the memory cell (MC) to be written connected to, and the current driver 106 and the pair of bit lines are connected via the column select circuit 102. A current control circuit 108 connects the bit line BL and the bit line (/BL) at the ends opposite to the ends connected to the column select circuit 102. Thus, a current path of the bit line (BL), the current control circuit 108 and the bit line (/BL) serially connected is formed.

Then, a write current ($I_{BL}$) supplied from the current driver 106 is flowed through the bit line (BL) and the bit line (/BL) via the column selective circuit 102 and the current control circuit 108. The bit line (BL) and the bit line (/BL) are arranged, turned back via the current control circuit 108, and at this time, the write current flowing through the bit line (BL) connected to the NAND-type cell block 100a and the write current flowing through the bit line (/BL) connected to the NAND-type cell block 10b flow in opposite directions. Thus, row-wise magnetic fields opposite to each other are applied to the MTJ element ($MTJ_1$) and the MTJ element ($MTJ_2$).

Thus, to the MTJ element ($MTJ_1$), the synthetic magnetic field of a magnetic field generated by the current flowing through the write word line ($WWL_2$) and the magnetic field generated by the current flowing through the bit line (BL) is applied, and to the MTJ element ($MTJ_2$), the synthetic magnetic fields of the magnetic field generated by the current flowing through the write word line ($WWL_2$) and the magnetic field generated by the current flowing through the bit line (/BL) is applied. The magnetic fields applied to the MTJ element ($MTJ_1$) and the MTJ element ($MTJ_2$) are opposite to each other, and a complementary resistance states can be memorized in the MTJ element ($MTJ_1$) and the MTJ element ($MTJ_2$).

Figure 4:
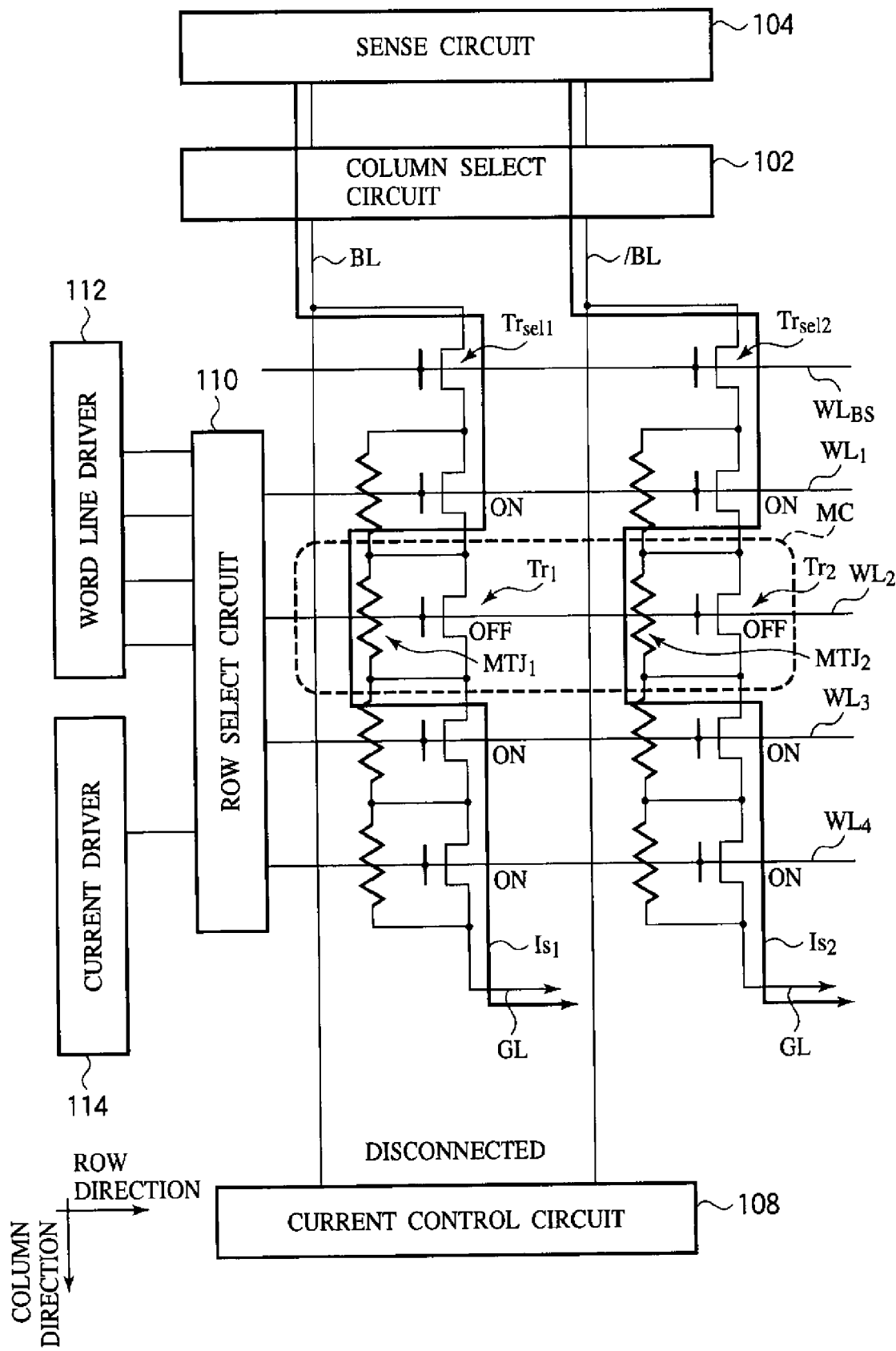
FIG. 4 is a circuit diagram showing a method for reading the magnetic memory device according to an embodiment of the present invention.

The method for reading the magnetic memory device according to the present embodiment is the same as the method for reading the magnetic memory device according to an embodiment shown in FIGS. 4 and 5.

Figure 13:
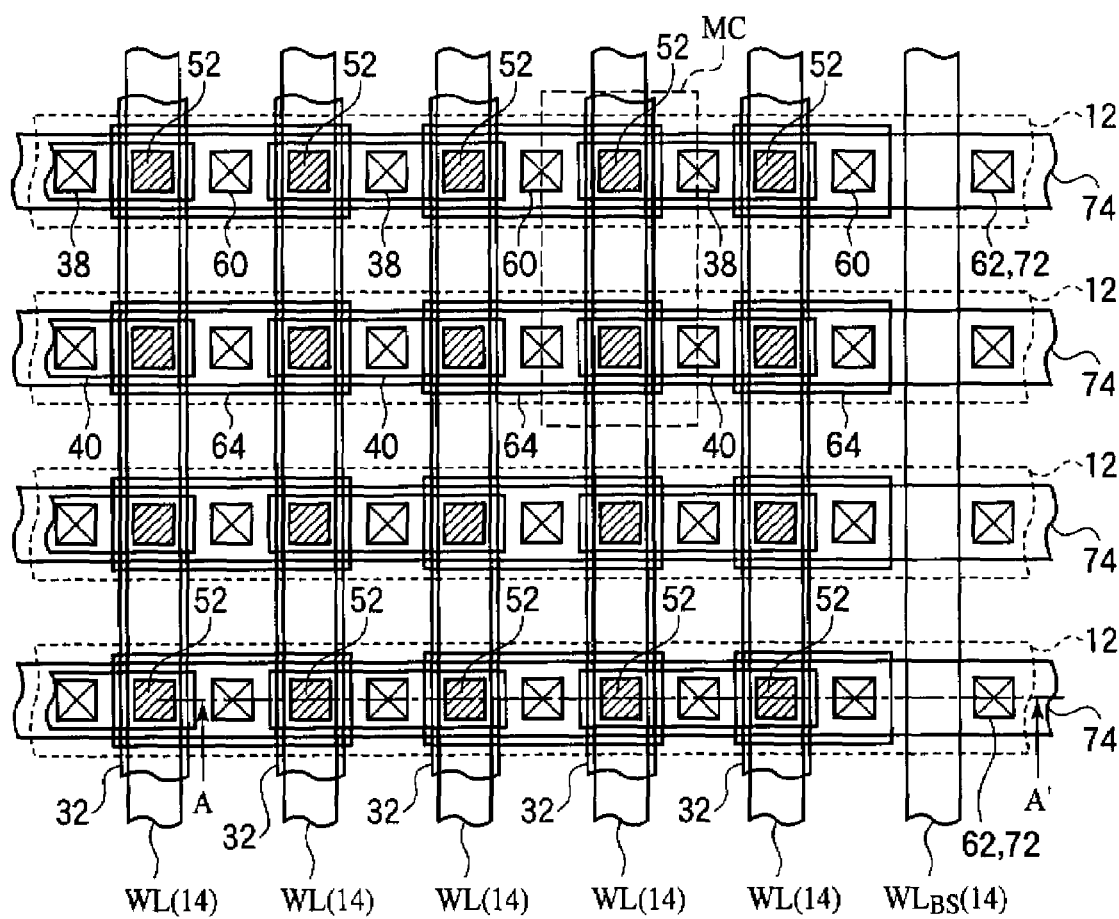
FIG. 13 is a plan view showing the structure of the magnetic memory device according to another embodiment of the present invention.
Figure 14:
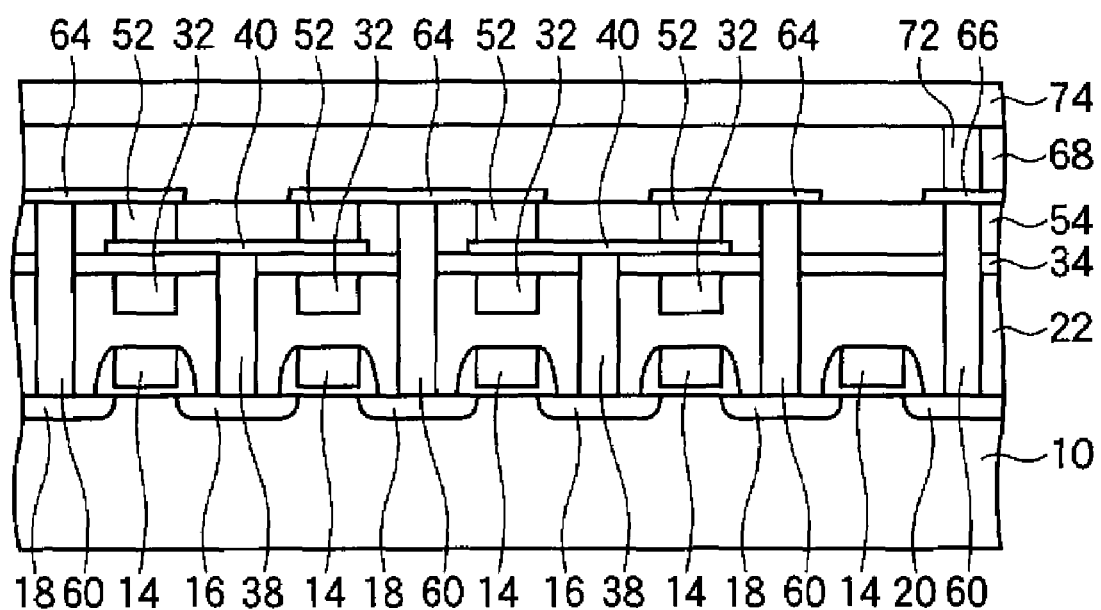
FIG. 14 is a diagrammatic sectional view showing the structure of the magnetic memory device according to another embodiment of the present invention.

Next, one example of the specific structure of the magnetic memory device for realizing the circuit of FIG. 12 will be explained with reference to FIGS. 13 to 15.

In a silicon substrate 10, a device isolation film 12 defining a plurality of active regions extended column-wise is formed.

Over the silicon substrate 10 with the device isolation film 12 formed in, a plurality of word lines WL and a cell block select word line $WL_{BS}$ are formed, extended row-wise. In the active regions on both sides of the word lines WL, source/drain regions 18, 20 are formed. In the active regions on both sides of the cell block select word line $WL_{BS}$, source/drain regions 18, 20 are formed. Thus, in each active region, a plurality of select transistors each including the gate electrode 14 functioning also as the word line WL and the source/drain regions 16, 18, and the cell block select transistor including the gate electrode 14 functioning also as the cell block select word line $WL_{BS}$ and the source/drain regions 18, 20 are formed. The adjacent transistors have the source/drain regions 16, 18 in common.

Over the silicon substrate 10 with the select transistors formed on, an inter-layer insulating film 22 is formed. In the inter-layer insulating film 22, a plurality of write word lines 32 are buried, extended row-wise. The respective write word lines 32 are formed above the respective word line WL. As shown in FIG. 15, the write word lines 32 are formed of a Ta film 26 as the barrier metal formed along the inside wall of the interconnection trenches 24, an NiFe film 28, whose magnetic permeability is high, provided for intensifying the magnetic field, and a Cu film 30 which is the major interconnection part.

Over the inter-layer insulating film 22 with the write word lines 32 buried in, an inter-layer insulating film 34 is formed. In the inter-layer insulating films 34, 22, contact plugs 38 connected to the source/drain regions 16 are buried. Over the inter-layer insulating film 24, an upper electrode layer 40 connected to the contact plugs 38 is formed.

On the lower electrode layer 40 at the intersections between the active regions and the write word lines 32, the MTJ elements 52 are formed. The MTJ elements adjacent column-wise with the contact plugs 38 formed therebetween are connected to each other by the lower electrode layer 40 and are electrically connected to the source/drain regions 16 via the contact plugs 38.

Figure 15:
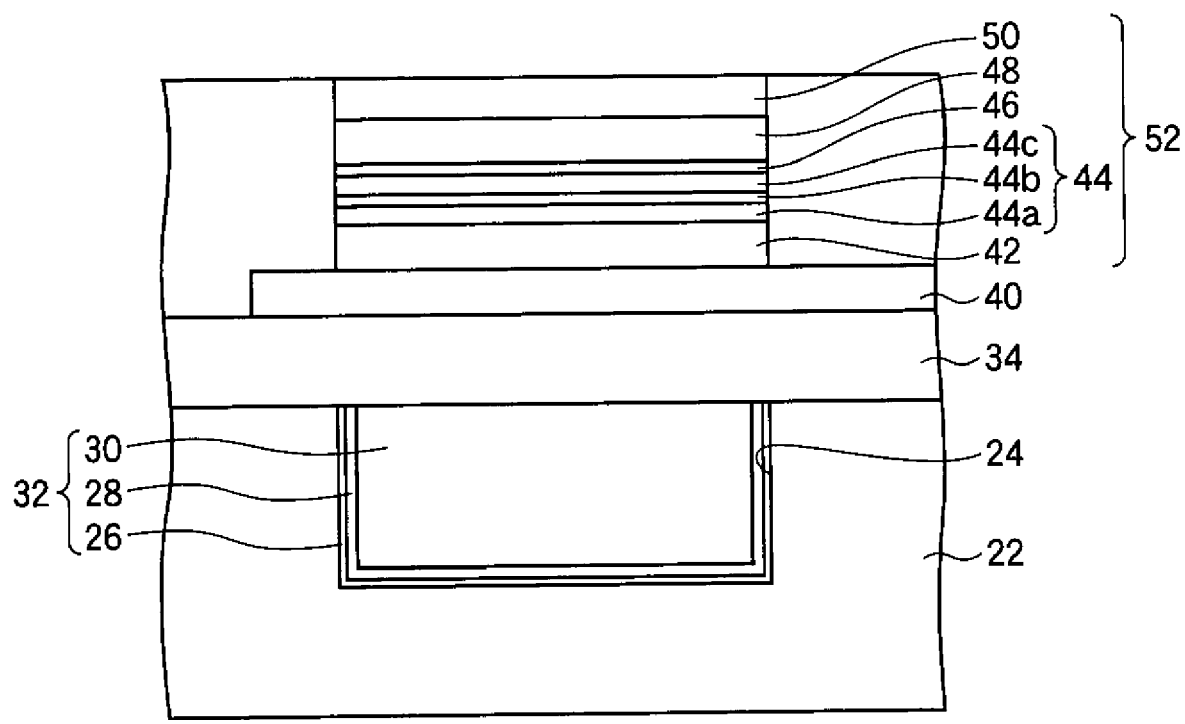
FIG. 15 is a partial sectional view showing the structure of the magnetic memory device according to another embodiment of the present invention.

As exemplified in FIG. 15, the MTJ elements 52 are formed of an antiferromagnetic layer 42 of PtMn film, a pinned magnetization layer 44 of a CoFe film 44a, an Ru film 44b and a CoFe film 44c, a tunnel insulating film 46 of alumina film, a free magnetization layer 48 of NiFe film, and a cap layer 50 of Ta film.

Over the inter-layer insulating film 34 and the lower electrode layer 40 in the region except the regions where the MTJ elements 52 are formed, an inter-layer insulating film 54 is formed. In the inter-layer insulating films 54, 34, 22, contact plugs 60 connected to the source/drain regions 18 and contact plugs 62 connected to the source/drain regions 20 are buried.

Over the inter-layer insulating film 54, an upper electrode layer 64 connected to the source/drain regions 18 via the contact plugs 60 and an interconnection layer 66 connected to the source/drain regions 20 via the contact plugs 62 are formed. The MTJ elements adjacent column-wise with the contact plugs 60 formed therebetween are connected to each other by the upper electrode layer 64 and electrically connected to the source/drain regions 18 via the contact plugs 60.

Over the inter-layer insulating film 54 with the upper electrode layer 64 and the interconnection layer 66 formed on, an inter-layer insulating film 68 is formed. In the inter-layer insulating film 68, contact plugs 72 connected to the interconnection layer 66 are buried.

Over the inter-layer insulating film 68 with the contact plugs 72 buried in, bit lines 74 connected to the source/drain regions 20 via the contact plugs 72, the interconnection layer 66 and the contact plugs 62 are formed.

Thus, the select transistors and the MTJ elements formed thereabove are parallelly connected to thereby form the parallelly connected sets. The parallelly connected sets arranged column-wise are connected serially to thereby form the unit cell blocks. The bit lines 74 are connected to one ends of the unit cell blocks via the cell block select transistors.

The same structure are formed over the active regions adjacent row-wise, and two parallelly connected sets connected to each other by the same word line WL form one memory cell (MC).

Next, the method of manufacturing the magnetic memory device according to the present embodiment will be explained with reference to FIGS. 16A to 17C.

First, in the same way as, e.g., in the method of manufacturing the magnetic memory device according to an embodiment shown in FIG. 10A, the select transistors and the cell block selective transistors are formed over the silicon substrate 10.

Then, over the silicon substrate 10 with the select transistors and the cell block select transistors formed on, silicon oxide film is deposited by, e.g., CVD method, and then the surface of the silicon oxide film is planarized by, e.g., CMP method to form the inter-layer insulating film 22 of the silicon oxide film.

Figure 16A:
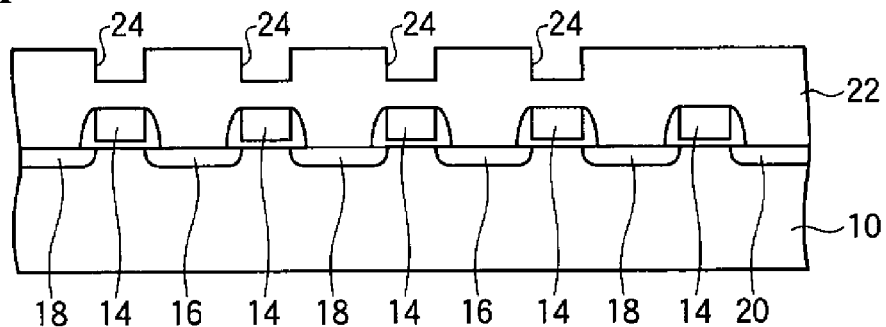
FIGS. 16A-16D and 17A-17C are sectional views showing the method of manufacturing the magnetic memory device according to another embodiment of the present invention.

Next, by photolithography and etching, in the inter-layer insulating film 22, interconnection trenches 24 for the write word lines 32 to be buried in are formed (FIG. 16A).

Then, the Ta film 26 and the NiFe film 28 are deposited by, e.g., sputtering method, and the Cu film 30 is deposited by, e.g., electroplating method. Then, these conductive films are planarized by CMP method to form the write word lines 32 buried in the interconnection trenches 24.

Next, over the inter-layer insulating film 22 with the write word lines 32 buried in, the inter-layer insulating film 34 of, e.g., silicon oxide film is formed by, e.g., CVD method.

Next, by photolithography and dry etching, in the inter-layer insulating films 34, 22, the contact holes 36 down to the source/drain regions 16 are formed.

Figure 16B:
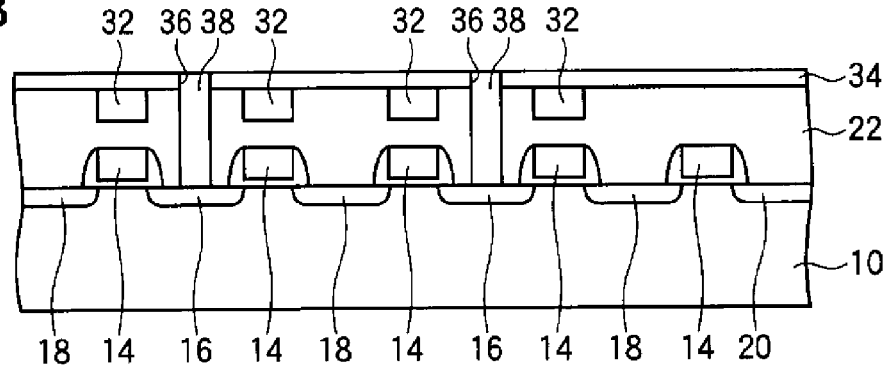

Next, by, e.g., CVD method, titanium nitride film as the barrier metal and tungsten film are deposited, and these conductive films are etched back or polished back to form the contact plugs 38 buried in the contact holes 36 and electrically connected to the source/drain regions 16 (FIG. 16B).

Then, by, e.g., sputtering method, e.g., 40 nm-thickness Ta film, the antiferromagnetic layer of, e.g., 20 nm-thickness PtMn film 42, the pinned magnetization layer of, e.g., 2 nm-thickness CoFe film 44a, e.g., 0.9 nm-thickness Ru film 44b and, e.g., 3 nm-thickness CoFe film 44c, the tunnel insulating film 46 of, e.g., a 1.2 nm-thickness alumina film, the free magnetization layer 48 of, e.g., a 6 nm-thickness NiFe film, and the cap layer 50 of, e.g., a 30 nm-thickness Ta film are sequentially formed (FIG. 15).

Figure 16C:
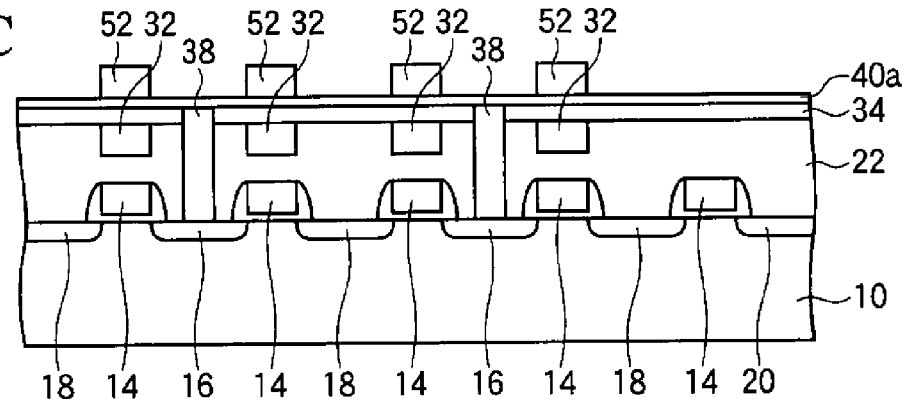

Next, by photolithography and dry etching, the cap layer 50, the free magnetization layer 48, the tunnel insulating film 36, the pinned magnetization layer 44 and the antiferromagnetic layer 42 are patterned to form the MTJ elements 52 (FIG. 16C).

Figure 16D:
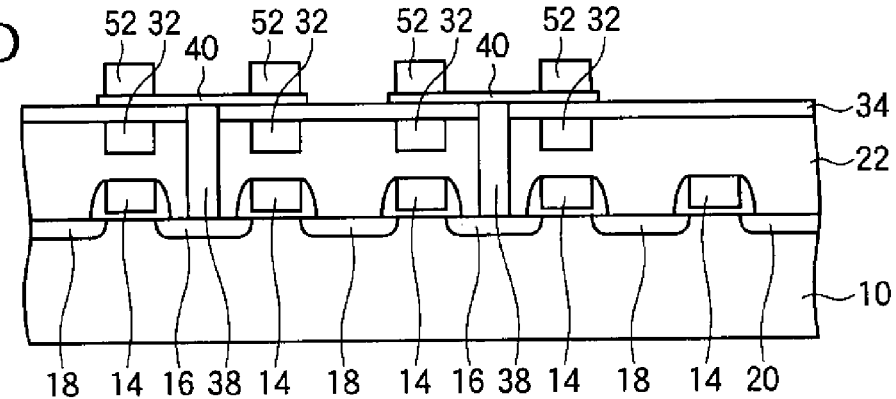

Then, by photolithography and dry etching, the Ta film 40a is patterned to form the lower electrode layer 40 serially connecting the column-wise adjacent MTJ elements 52 with the contact plugs 38 formed therebetween and connected to the source/drain regions 16 of the select transistors (FIG. 16D).

Next, over the inter-layer insulating film 22 with the MTJ elements formed on, silicon oxide film is deposited by, e.g., CVD method, and is planarized by CMP method until the MTJ elements 52 are exposed to thereby form the inter-layer insulating film 54 of the silicon oxide film having the surface planarized.

Next, by photolithograph and dry etching, in the inter-layer insulating films 54, 22, the contact holes 56 down to the source/drain regions 18 and the contact holes 58 down to the source/drain regions 20 are formed.

Figure 17A:
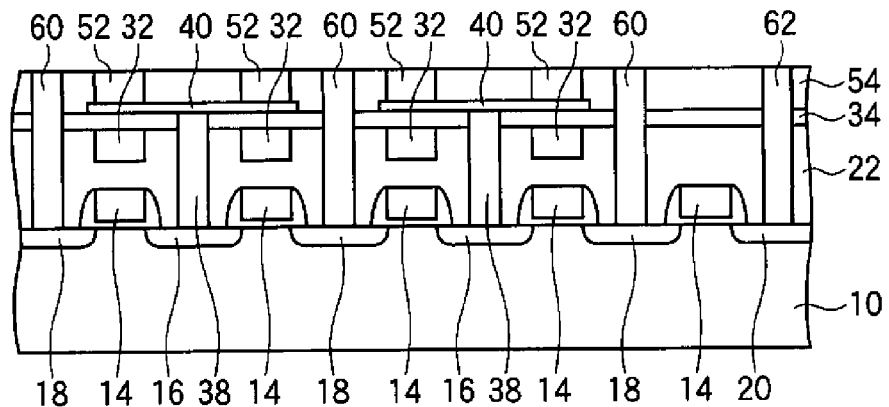

Next, by, e.g., CVD method, titanium nitride film as a barrier metal and tungsten film are deposited, and then these conductive films are etched back or polished back to form the contact plugs 60 buried in the contact holes 56 and electrically connected to the source/drain regions 18 and the contact plugs 62 buried in the contact holes 58 and electrically connected to the source/drain regions 20 (FIG. 17A).

Figure 17B:
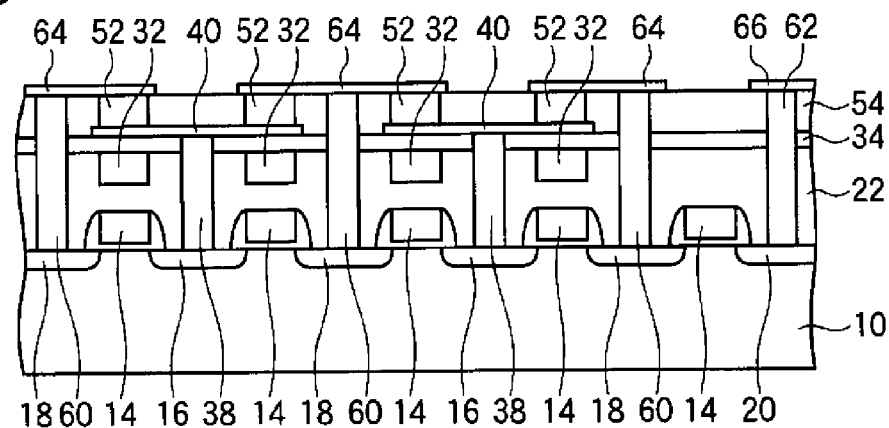

Then, over the inter-layer insulating film 54 with the MTJ elements 52 and the contact plugs 60, 62 buried in, a conductive film is deposited and patterned to thereby form the upper electrode layer 64 serially connecting the column-wise adjacent MTJ elements with the contact plugs 60 formed therebetween and connecting them to the source/drain regions 18 of the select transistors, and form the interconnection layer 66 connected to the contact plugs 62 (FIG. 17B).

Figure 11D:
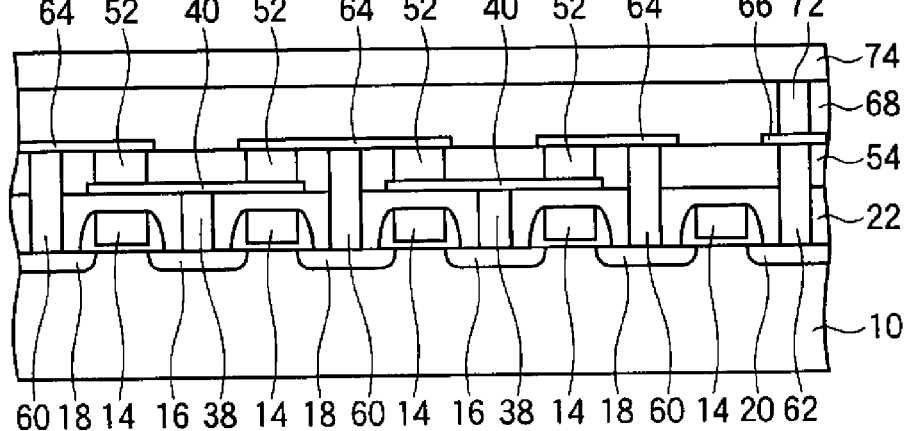
Figure 17C:
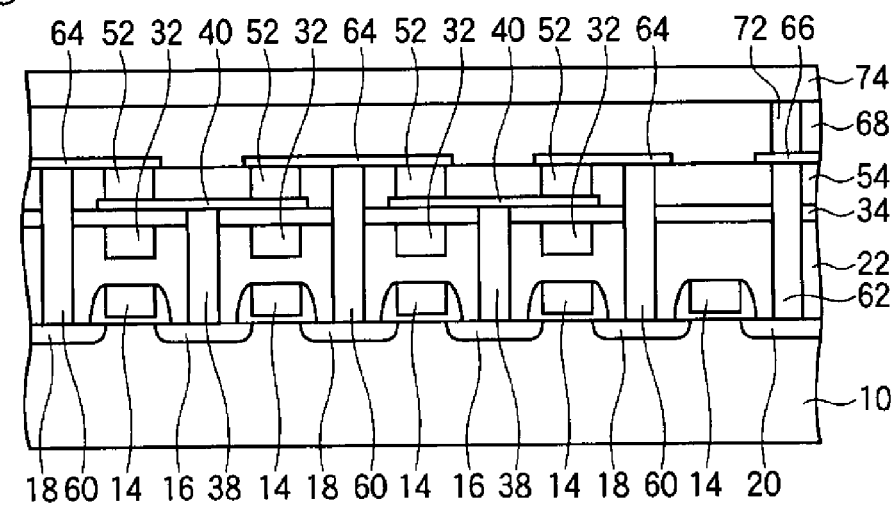

Next, in the same way as in, e.g., the method of manufacturing the magnetic memory device according to an embodiment shown in FIGS. 11C to 11D, the bit lines 74 electrically connected to the source/drain regions 20 via the contact plugs 72, the interconnection layer 66 and the contact plugs 62, etc. are formed (FIG. 17C).

Hereafter, insulating layers, interconnection layers, etc. are formed thereon as required, and the magnetic memory device is completed.

As described above, according to the present embodiment, the basic cell block includes 2T-2MTJ type memory cells each having two NAND-type cell blocks parallelly arranged, whereby the high integration which is an advantage of the NAND-type MRAM, and the large writing operation margin which is an advantage of the 2T-2MTJ type memory can be both realized. Specifically, the memory cell size which is substantially the same as the 1T-1MTJ type MRAM can ensure the reading operation margin equal to that of the 2T-2MTJ type MRAM. Thus, the magnetic memory device can have high reliability and high integration.

The present invention is not limited to the above-described embodiments and can cover other various modifications.

For example, in the above-described embodiments, the present invention is applied to the magnetic memory device using the MTJ element. However, the present invention is applicable widely to magnetic memory devices using the magnetoresistive effect elements utilizing the resistance changes based on relationships of spins between the magnetic layers, e.g., to the magnetic memory device using the magnetoresistive effect element including two magnetic layers stacked with a conductive nonmagnetic layer formed therebetween.

The structures and materials of the MTJ element and other elements are not limited to those of the embodiments described above and can be suitably changed. For example, in the above-described embodiments, the pinned magnetization layer 44 has the synthetic ferrimagnetic structure including the pinned magnetization layer 44 of the CoFe film 44a, the Ru film 44b and the CoFe film 44c, whereby the leakage magnetic field from the pinned magnetization layer 44 is decreased. However, the pinned magnetization layer can be, e.g., a single-layer structure of CoFe. In the above-described embodiments, the free magnetization layer 48 has the single layer structure of NiF but can have, e.g., the layer structure of CoFe/Ru/CoFe, as does the pinned magnetization layer 44.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A magnetic memory device comprising:
   a first signal line extended in a first direction;
   a second signal line extended in the first direction;
   a third signal line extended in a second direction intersecting the first direction;
   a memory cell including
      a first parallelly connected set which is disposed at an intersection of the first signal line and the third signal line and including a first magnetoresistive effect element and a first select transistor parallelly connected to each other and having one end connected to the first signal line, and
      a second parallelly connected set which is disposed at an intersection of the second signal line and the third signal line and including a second magnetoresistive effect element and a second select transistor parallelly connected to each other and having one end connected to the second signal line; and a read circuit connected to the first signal line and the second signal line, for reading information memorized in the memory cell, based on voltages of the first signal line and the second signal line.

2. The magnetic memory device according to claim 1, wherein the third signal line is a signal line for writing and reading and electrically connected to a gate electrode of the first select transistor and a gate electrode of the second select transistor.

3. The magnetic memory device according to claim 1, wherein the third signal line is a signal line for writing and electrically insulated from a gate electrode of the first select transistor and a gate electrode of the second select transistor, and which further comprises a fourth signal line electrically connected to the gate electrode of the first select transistor and the gate electrode of the second select transistor.

4. The magnetic memory device according to claim 1, further comprising:

a first current source disposed on one end of the first signal line and the second signal line, for supplying a write current to the first signal line and the second signal line; and a switching circuit disposed on the other end of the first signal line and the second signal line, for electrically connecting and disconnecting the first signal line and the second signal line.

5. The magnetic memory device according to claim 1, further comprising a second current source disposed on one end of the third signal lines, for supplying write current to the third signal lines.

6. A magnetic memory device comprising:

a first signal line extended in a first direction;

a second signal line extended in the first direction;

a plurality of third signal lines extended in a second direction intersecting the first direction;

a plurality of memory cells each disposed, associated with the third signal lines and each including a first parallelly connected set which is disposed at an intersection of the first signal line and the third signal line and including a first magnetoresistive effect element and a first select transistor parallelly connected to each other and having one end connected to the first signal line, and a second parallelly connected set which is disposed at an intersection of the second signal line and the third signal line and including a second magnetoresistive effect element and a second select transistor parallelly connected to each other and having one end connected to the second signal line; and a read circuit connected to the first signal line and the second signal line, for reading information memorized in the memory cells, based on voltages of the first signal line and the second signal line, a plurality of said memory cells forming a basic cell block including a first NAND-type cell block which is formed of the first parallelly connected sets serially connected to each other and has one end connected to the first signal line and the other end connected to a ground line, and a second NAND-type cell block which is formed of the second parallelly connected sets serially connected to each other and has one end connected to the second signal line and the other end connected to the ground line.

7. The magnetic memory device according to claim 6, further comprising a switching circuit provided between the first signal line and the first NAND-type cell block and between the second signal line and the second NAND-type cell block, for controlling the respective connections.

8. The magnetic memory device according to claim 6, further comprising a plurality of said basic cell blocks, a first contact connecting the first signal line and said first NAND-type cell block and a second contact connecting the second signal line and the second NAND-type cell block being in common with the adjacent basic cell blocks.

9. The magnetic memory device according to claim 6, further comprising a plurality of said basic cell blocks, a third contact connecting the first NAND-type cell block and a ground line and a fourth contact connecting the second NAND-type cell block and the ground line being in common with the adjacent basic cell blocks.

10. A method for writing into a magnetic memory device comprising a first signal line extended in a first direction; a second signal line extended in the first direction; a third signal line extended in a second direction intersecting the first direction; a memory cell including a first parallelly connected set which is disposed at an intersection of the first signal line and the third signal line and including a first magnetoresistive effect element and a first select transistor parallelly connected to each other and having one end connected to the first signal line, and a second parallelly connected set which is disposed at an intersection of the second signal line and the third signal line and including a second magnetoresistive effect element and a second select transistor parallelly connected to each other and having one end connected to the second signal line, the method comprising:

flowing a first write current through the first signal line, flowing through the second signal line a second write current in a direction opposite to a direction of flow of the first write current, and flowing a third write current through the third signal line, whereby a writing is made in a memory cell that resistance states of the first magnetoresistive effect element and the second magnetoresistive effect element have a complementary state.

11. The method for writing into a magnetic memory device according to claim 10, wherein the first signal line and the second signal line are electrically connected to each other at one end, whereby the first write current flowing through the first signal line is turned back to the second signal line to be used as the second write current.

12. The method for writing into a magnetic memory device according to claim 10, wherein the third signal line is electrically connected to a gate electrode of the first select transistor and a gate electrode of the second select transistor.

13. The method for writing into a magnetic memory device according to claim 10, wherein the third signal line is electrically insulated from a gate electrode of the first select transistor and a gate electrode of the second select transistor, and the magnetic memory device further includes a fourth signal line electrically connected to the gate electrode of the first select transistor and the gate electrode of the second select transistor.

14. The method for writing into a magnetic memory device according to claim 10, wherein the magnetic memory device further includes: a first current source disposed on one end of the first signal line and the second signal line, for supplying the first and the second write currents to the first signal line and the second signal line; and a switching circuit disposed on the other end of the first signal line and the second signal line, for electrically connecting and disconnecting the first signal line and the second signal line.

15. The method for writing into a magnetic memory device according to claim 10, wherein the magnetic memory device further includes a second current source disposed on one end of the third signal lines, for supplying the third write current to the third signal lines.

16. A method for reading a magnetic memory device comprising a first signal line extended in a first direction; a second signal line extended in the first direction; a plurality of third signal lines extended in a second direction intersecting the first direction; a plurality of memory cells each disposed, associated with the third signal lines and each including a first parallelly connected set which is disposed at an intersection of the first signal line and the third signal line and including a first magnetoresistive effect element and a first select transistor parallelly connected to each other and having one end connected to the first signal line, and a second parallelly connected set which is disposed at an intersection of the second signal line and the third signal line and including a second magnetoresistive effect element and a second select transistor parallelly connected to each other and having one end connected to the second signal line, and forming a first NAND-type cell block which is formed of the first parallelly connected sets serially connected to each other and has one end connected to the first signal line and a second NAND-type cell block which is formed of the second parallelly connected sets serially connected to each other and has one end connected to the second signal line and the other, the method comprising:

turning off the first select transistor and the second select transistor of a memory cell to be read and turning on the first select transistors and the second transistors of the other memory cells;

flowing a first sense current through the first NAND-type cell block via the first signal line to thereby output to the first signal line a first output voltage reflecting a resistance state of the first magnetoresistive effect element of the memory cell to be read;

flowing a second sense current equal to the first sense current through the second NAND-type cell block via the second signal line to thereby output to the second signal line a second output voltage reflecting a resistance state of the second magnetoresistive effect element of the memory cell to be read; and amplifying and comparing the first output voltage and the second output voltage by a sense circuit to thereby read information memorized in the memory cell.

17. The method for reading a magnetic memory device according to claim 16, wherein the magnetic memory device further includes a switching circuit provided between the first signal line and the first NAND-type cell block and between the second signal line and the second NAND-type cell block, for controlling the respective connections.

18. The method for reading a magnetic memory device according to claim 16, wherein the magnetic memory device further includes a plurality of said basic cell blocks, a first contact connecting the first signal line and said first NAND-type cell block and a second contact connecting the second signal line and the second NAND-type cell block are in common with the adjacent basic cell blocks.

19. The method for reading a magnetic memory device according to claim 16, wherein the magnetic memory device further includes a plurality of said basic cell blocks, a third contact connecting the first NAND-type cell block and a ground line and a fourth contact connecting the second NAND-type cell block and the ground line are in common with the adjacent basic cell blocks.

* * * * *